United States Patent
Matsuki et al.

(10) Patent No.: US 6,666,369 B2
(45) Date of Patent: Dec. 23, 2003

(54) SEMICONDUCTOR DEVICE MANUFACTURING METHOD, ELECTRONIC PARTS MOUNTING METHOD AND HEATING/MELTING PROCESS EQUIPMENT

(75) Inventors: Hirohisa Matsuki, Kawasaki (JP); Hiroyuki Matsui, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 31 days.

(21) Appl. No.: 10/013,506

(22) Filed: Dec. 13, 2001

(65) Prior Publication Data

US 2002/0076909 A1 Jun. 20, 2002

Related U.S. Application Data

(62) Division of application No. 09/691,075, filed on Oct. 19, 2000, now Pat. No. 6,344,407.

(30) Foreign Application Priority Data

Dec. 20, 1999 (JP) .............................. 11-361275
Aug. 14, 2000 (JP) ........................... 2000-245929

(51) Int. Cl.[7] ..................... B23K 28/00; B23K 31/02; B23K 1/20
(52) U.S. Cl. .................. 228/199; 228/202; 228/206; 228/287
(58) Field of Search ............................. 228/201, 202, 228/205, 206, 207–208, 334, 199; 252/79.1

(56) References Cited

U.S. PATENT DOCUMENTS

| | | | | |
|---|---|---|---|---|
| 3,935,285 A | * | 1/1976 | Tummes et al. | 568/877 |
| 4,283,847 A | * | 8/1981 | May | 29/832 |
| 4,389,254 A | * | 6/1983 | Tusset et al. | 134/3 |
| 4,437,905 A | * | 3/1984 | Nitto et al. | 148/623 |
| 4,459,743 A | * | 7/1984 | Watanabe et al. | 29/832 |
| 4,460,144 A | | 7/1984 | Kazaoka et al. | |
| 4,558,524 A | * | 12/1985 | Peck et al. | 134/3 |
| 4,921,156 A | | 5/1990 | Hohnerlein | |
| 5,046,658 A | * | 9/1991 | Morris | 148/623 |

(List continued on next page.)

FOREIGN PATENT DOCUMENTS

| | | |
|---|---|---|
| CN | 410537 | 11/2000 |
| JP | 62-102546 | 5/1987 |
| JP | 4-171888 | 6/1992 |
| JP | 04-220166 | 8/1992 |
| JP | 04-258737 | 9/1992 |
| JP | 05-211391 | 8/1993 |
| JP | 06-29659 | 2/1994 |
| JP | 06112644 | 4/1994 |
| JP | 06-190584 | 7/1994 |
| JP | 6-268358 | 9/1994 |
| JP | 06-326448 | 11/1994 |
| JP | 07-79071 | 3/1995 |
| JP | 07-164141 | 6/1995 |
| JP | 07-170063 | 7/1995 |
| JP | 8-155675 | 6/1996 |
| JP | 11233934 | 8/1999 |

OTHER PUBLICATIONS

Hosking et al.; "Fluxless Soldering Alternatives for CFC Elimination", Assembly, vol. 36 (1), p. 26 (1993).
Wei et al.; "Study of Fluxless Soldering Using Formic Acid", IEEE Transactions on Advanced Packaging, vol. 22 (4), p. 592 (1999).

*Primary Examiner*—M. Alexandra Elve
*Assistant Examiner*—Colleen P. Cooke
(74) *Attorney, Agent, or Firm*—Armstrong, Westerman & Hattori, LLP

(57) ABSTRACT

There is provided a semiconductor device manufacturing method which comprising the steps of forming solder bumps on an underlying metal film of a semiconductor device, and placing the semiconductor device and the solder layer in a reduced pressure atmosphere containing a formic acid to heat the solder bumps. Accordingly, the solder bumps can be formed without the use of flux not to generate voids in the solder layer, and also the cleaning required after the solder bumps are formed can be omitted.

18 Claims, 25 Drawing Sheets

U.S. PATENT DOCUMENTS

| | | | | |
|---|---|---|---|---|
| 5,065,692 A | * | 11/1991 | Hollesen et al. | 29/740 |
| 5,192,582 A | * | 3/1993 | Liedke et al. | 205/130 |
| 5,227,604 A | * | 7/1993 | Freedman | 228/123 |
| 5,234,149 A | | 8/1993 | Katz et al. | |
| 5,433,820 A | * | 7/1995 | Sindzingre et al. | 228/180.1 |
| 5,447,802 A | * | 9/1995 | Tobiyama et al. | 228/219 |
| 5,467,912 A | * | 11/1995 | Mishina et al. | 228/219 |
| 5,873,945 A | * | 2/1999 | Patzelt et al. | 228/37 |
| 5,934,540 A | * | 8/1999 | Scheurich | 219/121.63 |
| 5,967,402 A | * | 10/1999 | Kuwabara | 228/206 |
| 6,015,966 A | * | 1/2000 | Rehm | 216/13 |
| 6,036,083 A | * | 3/2000 | Luo et al. | 228/194 |
| 6,120,585 A | * | 9/2000 | Inomata et al. | 428/610 |
| 6,207,551 B1 | * | 3/2001 | Chungpaiboonpatana et al. | 219/388 |
| 6,354,481 B1 | * | 3/2002 | Rich et al. | 228/19 |

* cited by examiner

SEMICONDUCTOR DEVICE MANUFACTURING METHOD, ELECTRONIC PARTS MOUNTING METHOD AND HEATING/MELTING PROCESS EQUIPMENT

This is a divisional of application Ser. No. 09/691,075, filed on Oct. 19, 2000, now U.S. Pat. No. 6,344,407.

BACKGROUND OF THE INVENTION

1. Field of the Invention

The present invention relates to a semiconductor device manufacturing method, an electronic parts mounting method and a heating/melting process equipment and, more particularly, a semiconductor device manufacturing method containing a solder bump forming step, an electronic parts mounting method for mounting electronic parts on a substrate, etc. and a heating/melting process equipment employed in these methods.

2. Description of the Prior Art

As the method of forming the solder bump on the semiconductor substrate on which the semiconductor device is formed, there are the plating method, the printing method, the solder ball putting/melting method, etc. Then, the solder bump formed on the semiconductor substrate is melted and jointed to the connected material such as the wirings, etc. In case the solder bump is connected to the terminal of the wiring substrate, normally the method that melts the solder bump as well as cleans the terminal surface by removing the oxidized layer from the surface using the flux is employed.

If the flux is employed, the soldering step is performed via following processes.

First, when the flux that is coated on the deposited surface of the terminal, the wiring, etc. is heated, such flux can cover the deposited surface while activating the surface to prevent new oxidation, whereby the active state of the deposited surface can be maintained. Also, when the solder is melted on the deposited surface, such solder spreads over the deposited surface and dissolves a part of the flux. In addition, when the solder is cooled on the deposited surface, such solder is solidified and jointed to the deposited surface, so that the remaining flux and the dissolved product are solidified.

As the first one of the problems caused in such steps, there is the problem due to the removal of the flux.

In other words, in order to clean the deposited surface, the method of removing the solidified flux by using the organic solvent other than flon and Trichlene is employed. In this case, since the dissolved product cannot be simply removed by a small amount of organic solvent, a large amount of organic solvent must be consumed.

The use of flon and Trichlene has already been inhibited from viewpoints of the ozone depletion prevention and the ground water pollution prevention. Also, since other organic solvents have a harmful effect on the environment, it is desired to develop the solder bump forming method which does not need the cleaning.

Also, as the second one of the problems, it may be considered that the voids are formed in the inside of the solder bump in the middle of the solder melting. The voids generated at this time are still remained in the solder bump after the semiconductor device has been mounted, and thus the reliability of connection between the solder bump and the connected material is damaged. Accordingly, generation of the voids in the solder bump must be suppressed.

In contrast, in the electronic parts module mounting steps, it is normal that terminals of the electronic parts module are mouted on the wiring substrate under the condition that the flux or flux containing paste is coated on the surface of the wiring substrate, etc. Since the flux is dissolved by the heat at the time of mounting and thus the poisonous gas is generated, the safety of operation must be assured. Also, if the halogen component remains as the residue of the flux, corrosion and migration of the wiring on the substrate are promoted and therefore the thorough cleaning is needed, which acts as one cause to increase the production cost.

Following several methods have been known as the solder mounting step.

First, the method of reflowing the solder under the reduced pressure or vacuum atmosphere is set forth in Patent Application Publication (KOKAI) Hei 4-220166, Patent Application Publication (KOKAI) Hei 5-211391, Patent Application Publication (KOKAI) Hei 6-29659, Patent Application Publication (KOKAI) Hei 7-79071, Patent Application Publication (KOKAI) Hei 7-170063, etc. As the equipment used in the solder reflow, in Patent Application Publication (KOKAI) Hei 4-220166, for example, such a mechanism is employed that the preheating furnace and the reflow main furnace are arranged via the gate, the exhaust system is provided to them respectively, and only the nitrogen gas is introduced into the preheating furnace.

Second, the method of reflowing the solder by using the carboxylic acid is set forth in Patent Application Publication (KOKAI) Hei 6-190584, Patent Application Publication (KOKAI) Hei 6-267632, and Patent Application Publication (KOKAI) Hei 7-164141. The equipment used in the solder reflow has a configuration that introduces directly the inert gas, the reduction gas, the carboxylic acid solution, and the diketone solution into the heating zone and also foams the diketone. But the equipment has a mechanism that heats the substrate in the atmospheric pressure atmosphere without the gate and the exhaust system.

Third, the method of reflowing the solder by positively using the reducing gas is set forth in Patent Application Publication (KOKAI) Sho 62-102546, Patent Application Publication (KOKAI) Hei 2-41772, Patent Application Publication (KOKAI) Hei 4-258737, Patent Application Publication (KOKAI) Hei 6-190584, and Patent Application Publication (KOKAI) Hei 6-326448.

However, since the oxidized layer formed on the deposited surface cannot be easily removed even if the soldering method applied under the reduced pressure atmosphere is employed, the formability of the bump is degraded. Also, the inventors of the present invention could not obtain the improved result when they have examined the void-generation suppressing effect by merely producing the reduced pressure atmosphere.

Also, the void-generation suppressing effect could not be obtained at all by the soldering using the carboxylic acid.

In the meanwhile, in some cases the soldering applied in the hydrogen atmosphere is effective to reflow the solder bump at the high temperature. However, since the electrode pad acting as the underlying layer of the solder bump occludes the hydrogen and thus adhesiveness between the electrode pad and the underlying insulating layer is degraded, such a possibility is increased that the troubles such as peel-off of the electrode pad, etc. are caused. Further, it is set forth in Patent Application Publication (KOKAI) Hei 6-190584 that the hydrogen, etc. do not have substantially the reducing power for the oxidized layer at the temperature of less than 350° C.

SUMMARY OF THE INVENTION

It is an object of the present invention to provide a semiconductor device manufacturing method containing a solder bump forming step which is able to form a solder bump without the use of flux not to generate voids in a solder layer and also does not need cleaning after the solder bump is shaped, and a heating/melting process equipment employed in this method.

Also, it is another object of the present invention to provide an electronic parts mounting method containing a step which is able to simplify electronic parts module manufacturing steps by omitting the use of flux and at the same time improve the reliability of products and exert no influence upon the environment, and a heating/melting process equipment employed in this method.

Then, an advantages of the present invention will be explained hereunder.

According to the present invention, in the step of forming the solder bumps on the connected material or the step of mounting the solder of the electronic parts onto the connected material, the solder is heated/melted in the reduced pressure atmosphere containing the formic acid, or the solder is heated/melted in the reduced pressure atmosphere after the formic acid is coated on the surface of the solder.

Therefore, the oxidized layer on the surface of the connected material can be removed not to remain the residue on the surface, and good surface shapes of the bumps or good shapes of the solidified solder can be achieved. In addition, generation of the voids in the solder bumps and the soldering portion can be suppressed.

Furthermore, according to the present invention, since a phenomenon of embrittling the material to be connected does not occur, peel-off of the connected material can be prevented.

Besides, it is possible to omit the cleaning after the solder bumps are formed or the solder is solidified. However, if the formic acid remains on the surface of the solder, there is a possibility to reoxide the solder in the air. Therefore, it is preferable that, after the solder is heated/melted and then solidified, the heating of such solder should be held at the temperature of below the melting point of the solder and in excess of the boiling point of the formic acid. As a result, since the formic acid can be evaporated from the surface of the solder, reoxidation of the solder can be prevented.

If the formic acid is supplied previously to the surface of the solder before the solder is heated/melted, the reduction of the formic acid is gradually proceeded in the course of the gradual increase of the solder temperature. Therefore, the voids generated in the solder or the voids existing in the solder can be escaped gradually. As a result, since the voids disappear once, the defective shape of the solder and the scattering of the solder are not caused.

According to the heating/melting process equipment of the present invention, since the formic acid recovering mechanism and the formic acid decomposing mechanism are provided on the exhaust side of the heating/melting chamber, scattering of the formic acid into the air can be previously prevented. Also, since the heating mechanism for heating the formic acid is provided to the portion that discharges the formic acid into the chamber, the droplet state of the formic acid on the surface of the solder can be suppressed. As a result, the formic acid is difficult to remain on the surface of the solder after the solder has been heated/melted, and thus reoxidation of the solder can be prevented.

DETAILED DESCRIPTION OF THE PREFERRED EMBODIMENTS

Embodiments of the present invention will be explained in detail with reference to the accompanying drawings hereinafter.

First Embodiment

The inventors of the present invention have thought about the technique that can remove the voids formed in the solder layer in the middle of the solder melting as well as the oxidized layer formed on the solder deposited surface at the same time by heating the solder jointed surface, e.g., the surface of the electrode or the surface of the wiring, and the solder in the reduced pressure or vacuum atmosphere and also supplying the gaseous carboxylic acid to such atmosphere.

As the carboxylic acid, for example, there are formic acid, acetic acid, acrylic acid, propionic acid, butyric acid, caproic acid, oxalic acid, succinic acid, salicylic acid, malonic acid, enanthic acid, caprylic acid, pelargonic acid, lactic acid, capric acid, etc. In actual use, one of them may be selected, otherwise a plurality of them may be selectively mixed.

The reducing action of them onto the copper oxide is given by the following chemical formula. In this case, R represents hydrogen or various hydrocarbon radicals in the following chemical formula.

$$2(R\text{-}COOH) + CuO = (R\text{-}COO)_2Cu + H_2O$$

TABLE 1

| Chemical property data list of Carboxylic acid | | | | | | | | | | |
|---|---|---|---|---|---|---|---|---|---|---|
| Carboxylic acid seed | (A) | (B) | (C) | (D) | (E) | (F) | (G) | (H) | (I) | (J) |
| IPA | 82.5 | 11.7 | 369 | 44 | ~800 | 2.5% | 0.66% | 2.63% | | |
| formic acid | 100.5 | 69 | 601 | 43 | 748 | 18.0% | | | irritant odor | Gas |
| acetic acid | 118.2 | 43 | 240 | 15 | 411 | 5.4% | | | irritant odor | Gas |
| acrylic acid | 141 | 54.4 | 429 | 3.1 | 195 | 3.0% | | | | Gas |
| propionic acid | 141 | — | | | 190 | | | | irritant odor | Gas |
| butyric acid | 164 | — | | | | | | | | Gas |
| caproic acid | 205 | — | | | | | | | unpleasant odor | Gas |
| enanthic acid | 223 | — | | | | | | | | Gas |
| caprylic acid | 239 | — | | | | | | | | Solu. |
| pelargonic acid | 253 | — | | Solid | | | | | | Solu. |
| oxalic acid | 157 | — | — | — | — | | | | | Solu. |
| malonic acid | 140 | — | | | ~40 | | | | decomposition by heating | Gas |
| succinic acid | 235 | — | | Solid | | | | | | Solu. |
| salicylic acid | 256 | — | | Solid | <120S | | | | | Solu. |
| lactic acid | 119 | — | | | | | | | change into acrylic acid by heating | Gas |
| capric acid | 269 | — | | | | | | | | Solu. |

Figure 1:
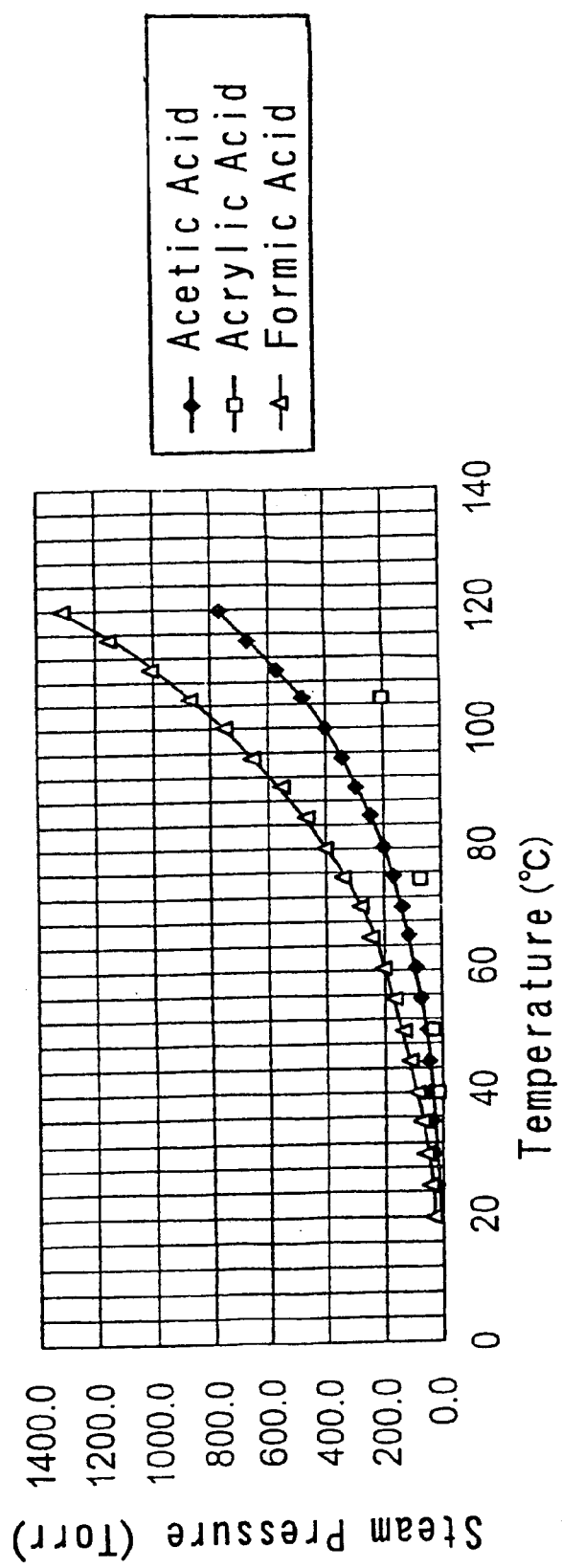
FIG. 1 is a graph showing a relationship between a temperature of carboxylic acid and a steam pressure used in the present invention.

(A): Boiling point
(B): Flash point
(C): Ignition point
(D): Stream pressure (RT)
(E): Stream pressure (100° C.)
(F): Explosive limit
(G): 5 Torr concentration
(H): 20 Torr concentration
(I): Feature
(J): Recommended introducing mode Chemical properties of the formic acid and the other carboxylic acid are given in Table 1. A curve between a temperature of the formic, acrylic, or acetic acid vs a steam pressure is shown in FIG. 1.

Normally the reducing action of the carboxylic acid becomes remarkable at the temperature in excess of the boiling point, especially at the high temperature of more than 200° C. Thus, the oxide of the solder and the oxide of nickel (Ni) and copper (Cu) on the deposited surface can be easily reduced. Therefore, the deposited surface and the solder are satisfactorily jointed.

Since the carboxylic acid acting to contribute the reduction produces no residue unlike the case where the flux is used, the cleaning to be performed after the soldering is not utterly needed.

Also, the voids generated in the solder layer in the middle of the soldering are caused by either the nonwetting due to the unremoval of the oxidized layer on the deposited surface or the gas generated during the solder heating.

If the solder layer is heated/melted in the reduced pressure atmosphere containing the carboxylic acid, generation of the voids can be easily prevented.

In the present invention, in the step of forming the solder onto the semiconductor device or in the step of connecting the solder of the electronic parts module and the wiring, an atmospheric concentration in the carboxylic acid gas having the flammability can be satisfactorily reduced by introducing an atmospheric gas containing the carboxylic acid in the reduced pressure atmosphere during heating, and therefore the safety can be improved rather than the prior art. Also, as a supply source of the carboxylic acid introduced into the reduced pressure atmosphere, the organic solvent having the boiling point of less than 150° C. or the solution like diketone or the material obtained by diluting the carboxylic acid with water may be employed. If the water is used, a cost is reduced lower.

The pressure of the carboxylic acid gas may be decided in the wide range of 13 Pa to 18000 Pa, preferably 660 Pa to 8000 Pa by taking an oxidation level of the surface of the connected material into consideration. If the oxidation level of the surface of the connected material is low, the safety and the economy can be improved by reducing an introducing amount and a content of the carboxylic acid gas. However, as shown in Table 1, since the carboxylic acid has the relatively low ignition point and the relatively low explosive limit at the pressure higher than the above pressure, such carboxylic acid is in danger of the ignition or explosion of the gas. Therefore, it is preferable that the solder should be used under the condition that is below the ignition point and the explosive limit of the carboxylic acid supplying material.

The partial pressure of the carboxylic acid in the reduced pressure atmosphere needs 10% or more in the atmosphere of total pressure 1 Torr, for example. Thus, if the pressure of 9.33 Pa (0.07 Torr) is given by introducing merely the carboxylic acid into the reduced pressure atmosphere, the oxide on the surface of the metal film under the solder bump cannot be removed.

Next, steps of forming the solder bump on the semiconductor substrate (semiconductor wafer) will be explained hereunder.

Figure 2A:
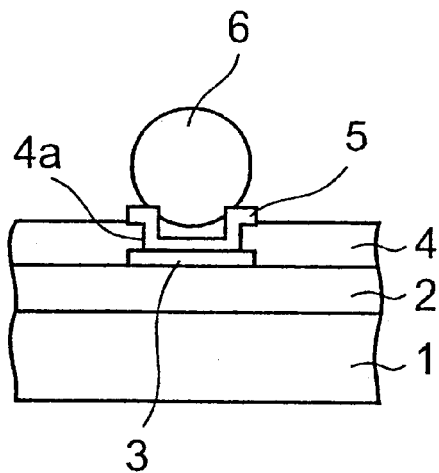
FIGS. 2A to 2C are sectional views showing steps of forming a solder bump in a semiconductor device according to embodiments of the present invention.

First, as shown in FIG. 2A, an insulating film 2 is formed on a silicon (semiconductor) substrate 1 on which semiconductor devices (not shown) such as transistors, etc. are formed, and then an electrode pad 3 is formed thereon. Although not shown in FIG. 2A, a plurality of electrode pads 3 are formed on the insulating film 2. The electrode pad 3 is electrically connected to the semiconductor devices formed on the silicon substrate 1. Also, the insulating film 2 may be formed to insulate the multi-layered wirings mutually or to cover the semiconductor devices formed on the silicon substrate 1.

Then, an insulating cover film 4, e.g., a silicon oxide layer, is formed on the insulating film 2 and the electrode pad 3, and then an opening 4a for exposing the electrode pad 3 is formed by patterning the cover film 4 by virtue of the photolithography method. Then, an underlying metal film 5 is formed as an area array bump on the electrode pad 3 in the opening 4a formed in the cover film 4 and its peripheral area. The underlying metal film 5 is formed by forming a titanium (Ti) layer and a nickel (Ni) layer in sequence. The upper nickel layer acts as the connected material and a thin nickel oxide, although not shown, is formed on a surface of the nickel layer.

Then, a lead-tin (PbSn) solder bump 6 is provided over the underlying metal film 5 on the opening 4a by the electrolytic plating method, the printing method, the solder ball putting/melting method, etc. FIG. 2A shows a state that a solder ball is provided as the solder bump 6.

Figure 2B:
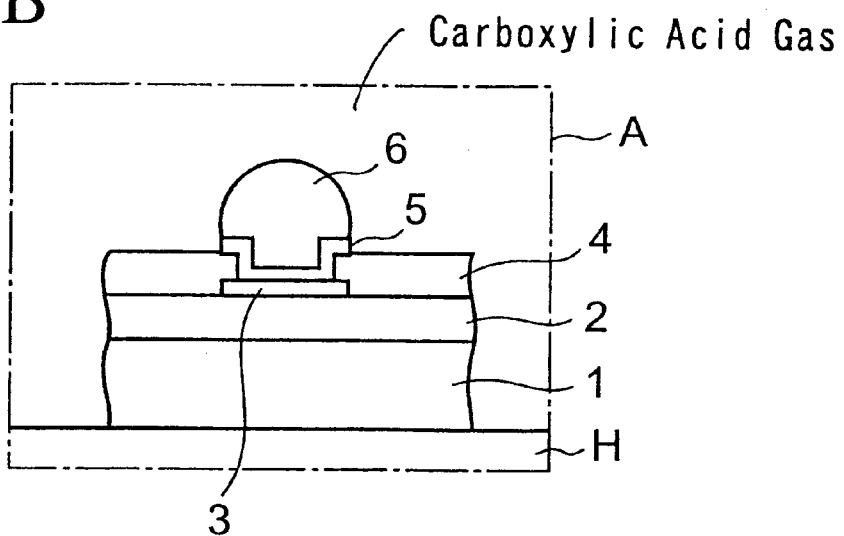

Then, as shown in FIG. 2B, the silicon substrate 1 is put into the reduced pressure atmosphere A containing the carboxylic such as the formic acid gas, and then the solder bump 6 is heated by the heater H to thus reflow the solder bump 6. This reduced pressure atmosphere A is formed in a heating/melting chamber in the embodiments described later.

As the process performed before the solder bump 6 is heated/melted by the heater H, the carboxylic acid such as formic acid may be introduced into the reduced pressure atmosphere A in the form of gas or solution. This preprocessing may be adopted in respective embodiments described later.

The reducing gas other than the carboxylic acid is not introduced into the reduced pressure atmosphere A. Under this environment, the solder bump 6 is melted to adhere tightly to the electrode pad 3 and then the temperature is lowered below the melting point of the solder. In this case, introduction of the carboxylic acid gas may be stopped in the course of the solder melting.

TABLE 2

| (A) | (B) | (C) | (D) | (E) | (F) | (G) | (H) | (I) | (J) | (K) | (L) |
|---|---|---|---|---|---|---|---|---|---|---|---|
| 1 | Pb95:5Sn | Ni | 400 | — | 0.02 | — | — | — | 0 | (many voids) | use of flux 0.8 mg/mm² |
| 2 | Pb95:5Sn | Ni | 350 | formic acid | 1.12 | Gas | — | before solder melting | 100 | 12.6 | flux less short-time melting |
| 3 | Pb95:5Sn | Ni | 355 | formic acid | 0.4 | Gas | — | before solder melting | 99.7 | <0.5 | flux less short-time melting |

TABLE 2-continued

| (A) | (B) | (C) | (D) | (E) | (F) | (G) | (H) | (I) | (J) | (K) | (L) |
|---|---|---|---|---|---|---|---|---|---|---|---|
| 4 | Pb60:40Sn | Ni | 280 | acrylic acid | 20 | Gas | Xe | ↑ before solder melting | 100 | <0.5 | ↑ |
| 5 | SnPb97:3Cu | Ni | 300 | caproic acid | 10 | Gas | Ar | ↑ | 98 | <0.1 | ↑ |
| 6 | Sn96:Ag2.5:1.5Bi | Ni | 280 | caprylic acid | 3 | Solu. | IPA | ↑ | 95 | <0.1 | ↑ |
| 7 | Pb95:5Sn | Cu | 380 | formic acid | 15 | Gas | (He) | before solder melting | 100 | <0.1 | ↑ |

Figure 2C:
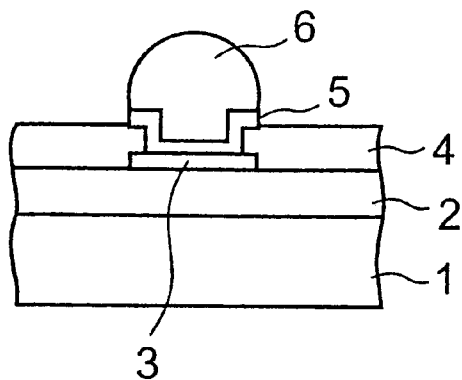

(A): Sample
(B): Solder composition (atm ratio)
(C): Connected material
(D): Heating peak temperature (° C.)
(E): Carboxylic acid seed
(F): Atmosphere pressure (Torr)
(G): Introducing mode
(H): Mixed gas
(I): Introducing timing
(J): Bump shape inspection yield (%)
(K): Void occuring rate in the bump (%)
(L): Remarks Then, as shown in FIG. 2C, the silicon substrate 1 is taken out into the atmosphere from the reduced pressure atmosphere A and then cooled.

Experimental results given in Table 2 are obtained by repeating the above steps according to of the present invention and the steps in the prior art while changing solder composition, type of the carboxylic acid gas, pressure of the reduced pressure atmosphere A, heating temperature, and heating time.

Samples 1 to 7 in Table 2 are experimental results that are obtained by forming the solder bump on the semiconductor chip whose size is 9.8 mm×9.8 mm.

The sample 1 in Table 2 is the experimental results that are obtained by heating the solder bump in the reduced pressure atmosphere not containing the carboxylic acid. The shape of the solder bump is not formed as an almost spherical shape.

In addition, when the inside of the solder bump is monitored by the X-ray, the solder bump in which the voids are generated occurs frequently.

In contrast, the samples 2 to 7 correspond to the experimental results that are obtained by heating the solder bump in the reduced pressure atmosphere that contains the carboxylic acid gas or the carboxylic-acid containing gas. An outer shape of the solder bump becomes good since it is shaped as an almost spherical shape at a probability of 100% or close to 100%. Also, when the void occurring rate of the samples 2 to 7 is checked, it is less than 1% except the sample 2. Although the same type carboxylic acid, i.e., the formic acid is used in the sample 2 and the sample 3, the void occurring rate of the sample 2 becomes high such as 12.6%.

TABLE 3

| | Processing Condition | | | | | | | | | | Results | | | |
|---|---|---|---|---|---|---|---|---|---|---|---|---|---|---|
| (A) | (B) | (C) | (D) | (E) | (F) | (G) | (H) | (I) | (J) | (K) | (L) | (M) | (N) | (O) |
| 1 | Wf | Pb95:5Sn | 320 | 1.33 | formic acid | 0.4 | 53.2 | | 370 | 3 | NG/crater, glaze | 100.00 | void | 11.31 |
| 2 | Chip | ↑ | ↑ | ↑ | ↑ | 1.12 | 148.96 | | 350 | 3 | OK/VI good, glaze | 9.65 | void | 5.67 |
| | | Pb95:5Sn | 320 | 1.33 | formic acid | | | | | | | | | |
| 3 | Chip | ↑ | ↑ | ↑ | ↑ | 0.4 | 53.2 | | 380 | 10 | OK/glaze | 1.00 | almost no void | 1.09 |
| 4 | ↑ Chip | ↑ | ↑ | ↑ | N$_2$ | 0.02 | 2.66 | | 400 | 20 | NG/many craters | 100.00 | many voids | 100.00 |
| 5 | Wf | ↑ | ↑ | ↑ | N$_2$ + flux | 0.02 | 2.66 | | 380 | 10 | ↑ NG/many craters | 100.00 | | 0.01 |
| 6 | ↑ | ↑ | ↑ | ↑ | ↑ | 0.02 | 2.66 | | 395 | 3 | ↑ | 100.00 | | 0.04 |
| 7 | ↑ | Pb95:5Sn | 320 | 0.5 | formic acid | 1.0 | 133.0 | 400 | 375 | 15 | OK/glaze | <0.5 | no void | <0.5 |
| 8 | ↑ | ↑ | ↑ | ↑ | ↑ | 5.0 | 665.0 | 400 | 375 | 15 | OK/glaze | <0.3 | no void | <0.5 |
| 9 | ↑ | ↑ | ↑ | ↑ | ↑ | 6.0 | 798.0 | 400 | 375 | 8 | OK/glaze | 0.50 | | <0.5 |
| 10 | ↑ | ↑ | ↑ | ↑ | ↑ | 1.0 | 133.0 | 360 | 350 | 3 | OK/glaze | <0.2 | void | 12.60 |
| 11 | ↑ | ↑ | ↑ | ↑ | ↑ | 0.4 | 53.2 | 365 | 355 | 15 | OK/glaze | <0.3 | | <0.5 |
| 12 | Wf | Pb64:36Sn | 183 | 0.5 | formic acid | 5.0 | 665.0 | 240 | 230 | 15 | glaze | 1.00 | no void | <0.5 |
| 13 | ↑ | ↑ | ↑ | ↑ | ↑ | 1.0 | 133.0 | 240 | 230 | 15 | | <0.5 | | <0.5 |

TABLE 3-continued

| | | | | | Processing Condition | | | | | | | Results | | |
|---|---|---|---|---|---|---|---|---|---|---|---|---|---|---|
| (A) | (B) | (C) | (D) | (E) | (F) | (G) | (H) | (I) | (J) | (K) | (L) | (M) | (N) | (O) |
| 14 | ↑ | ↑ | ↑ | ↑ | ↑ | 1.0 | 133.0 | 203 | 193 | 5 | | 1.00 | | <1 |
| 15 | ↑ | ↑ | ↑ | ↑ | ↑ | 1.0 | 133.0 | 218 | 208 | 15 | | 1.00 | | <0.5 |

(A): Sample
(B): Processing vehicle
(C): Solder composition
(D): Melting point (° C.)
(E): Exhaust capability (Pa)
(F): Atmosphere gas
(G): Pressure (Torr)
(H): Pressure (Pa)
(I): Setting maximum temperature (° C.)
(J): Real peak temperature (° C.)
(K): Melting point up temperature holding time (min)
(L): Appearance
(M): Fraction defective (%)
(N): Void
(O): Fraction defective (%)

Therefore, when the inventors of the present invention melts the solder by using the formic acid as the carboxylic acid while changing solder composition, atmosphere gas, pressure, heating time, heating temperature, etc., results given in Table 3 are obtained. In Table 3, the case where the gas other than the carboxylic acid is used is given as comparative examples.

Samples 1 to 3 and samples 7 to 15 in Table 3 show the case where the formic acid is used. It becomes apparent that the void occurring rate is reduced if the heating holding time at the temperature in excess of the melting point (m.p.) is set to more than five minutes and that the void occurring rate is increased if the heating holding time is set shorter than this time, e.g., three minutes. Both the appearance fraction defective and the void occurring rate are reduced in other cases.

In contrast, samples 4 to 6 in Table 3 show the conventional cases where the carboxylic acid is not used. The appearance fraction defective or the void occurring rate is reduced in either case.

Figure 3:
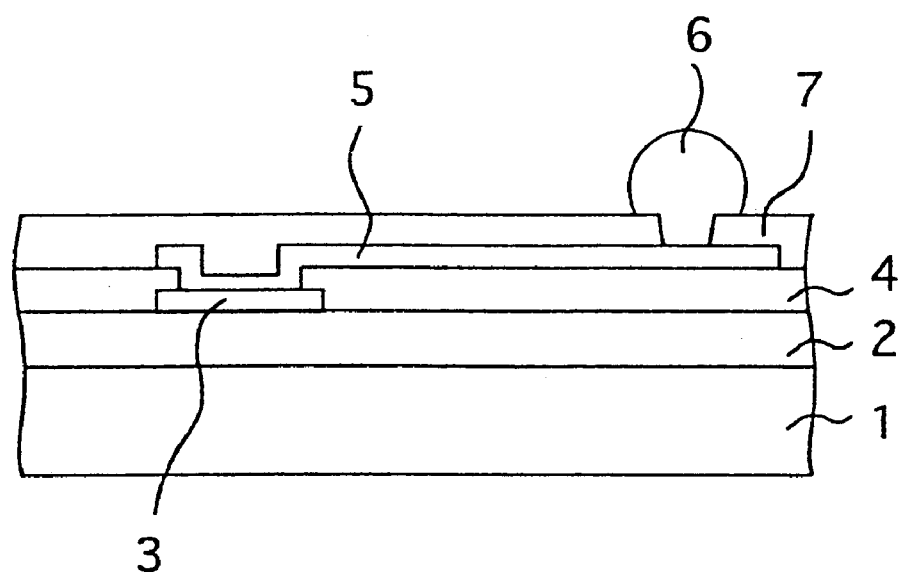
FIG. 3 is a sectional view showing steps of forming another solder bump in the semiconductor device according to the embodiments of the present invention.

In this case, the structure to which the solder bump is connected is not limited to the above example. Another solder bump having the structure shown in FIG. 3 may be employed.

Second Embodiment

An equipment used to form the solder bump described in the first embodiment of the present invention will be explained hereunder.

Figure 4:
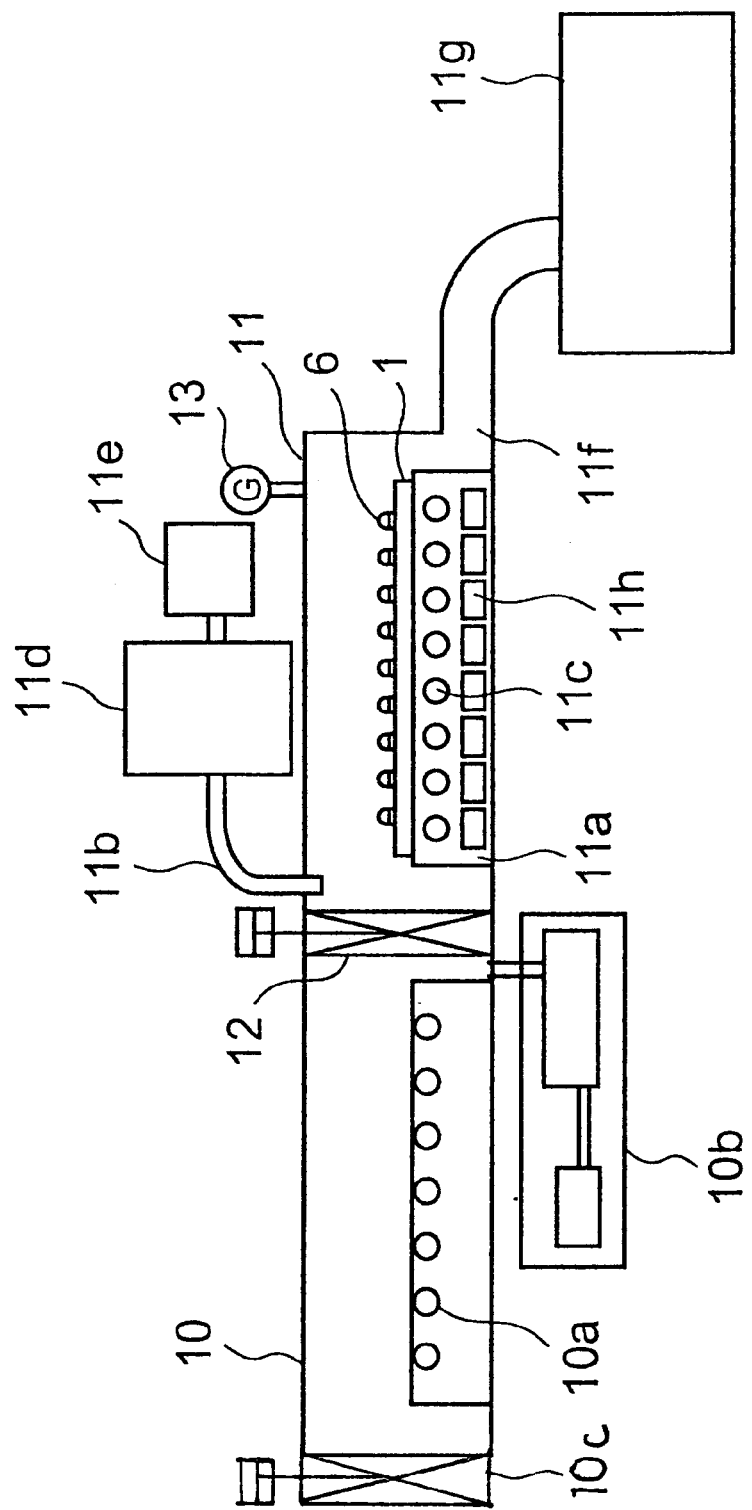
FIG. 4 is a view showing a configuration of a heating/melting process equipment used to heat/melt the solder bump in a semiconductor device according to a second embodiment of the present invention.

FIG. 4 is a view showing a configuration of a heating/melting process equipment used to form the solder bump in the semiconductor device of the present invention.

The heating/melting process equipment shown in FIG. 4 comprises a semiconductor device carrying chamber 10 for carrying the semiconductor wafer 1 on which the semiconductor devices are formed, and a heating/melting chamber 11 for heating the solder bump 6 on the semiconductor wafer 1. The semiconductor device carrying chamber 10 and the heating/melting chamber 11 are connected via a gate valve 12.

A semiconductor wafer heating/carrying table 11a is installed in the heating/melting chamber 11, and a gas introducing pipe 11b is connected over the heating table 11a. A heat transfer heater 11c is provided in the heating table 11a. Also, the gas introducing pipe 11b is connected a gas introducing mechanism 11d on the outside of the heating/melting chamber 11. The carboxylic acid gas or the carboxylic-acid containing gas is introduced from a gas supply source 11e into the heating/melting chamber 11 via the gas introducing mechanism 11d and the gas introducing pipe 11b. In this case, illustration of a semiconductor wafer carrying mechanism on the heating table 11a is omitted.

An exhaust port 11f is provided to the heating/melting chamber 11, and an exhausting apparatus 11g is connected to the exhaust port 11f. A pressure in an interior of the heating/melting chamber 11 is reduced into a predetermined pressure by the exhausting apparatus 11g. Also, a cooling module 11h is built in the heating table 11a such that a heating temperature profile can be strictly managed.

In contrast, a carrying mechanism 10a for loading the semiconductor wafer 1 into the heating/melting chamber 11 and unloading the semiconductor wafer 1 from the heating/melting chamber 11 is provided in the semiconductor device carrying chamber 10, so that a wafer carrying process time can be reduced. An arm-like robot may be arranged in place of the carrying mechanism 10a. In addition, a gate valve 10c is provided to an opening portion, that is used to load/unload the semiconductor wafer 1, in the semiconductor device carrying chamber 10.

Also, since a pressure in an inside of the semiconductor device carrying chamber 10 is reduced into a predetermined pressure by connecting an exhausting apparatus 10b to the semiconductor device carrying chamber 10, sample exchange tact in the heating/melting chamber 11 can be reduced. The exhausting apparatus 10b connected to the semiconductor device carrying chamber 10 may be omitted as the case may be.

As the exhausting apparatus, one or more of hydraulic pump, sorption pump, dry pump, oil circulating pump, oil diffusing pump, turbo-molecular pump, cryopump, etc., for example, may be employed.

The carrying of the semiconductor wafer 1, open/close of the gate valves 10c, 12, adjustment of the heating temperature, adjustment of the exhaust amount, and adjustment of the gas flow rate can be controlled by a control circuit (not shown) respectively.

A vacuum gauge 13 is fitted to the above heating/melting chamber 11 as occasion demands. The vacuum gauge is used to manage the pressure in the heating/melting chamber 11 to which the formic or other carboxylic acid containing gas is introduced, whereby it is possible to work safely.

If the solder bump is formed by using the equipment shown in FIG. 4, the semiconductor wafer 1 on which the solder bump 6 shown in FIG. 2A is formed is carried onto the heating table 11a in the heating/melting chamber 11 via the semiconductor device carrying chamber 10, and then the gate valve 12 is closed. Then, under the conditions described in the first embodiment, the solder bump 6 is reflown, as shown in FIG. 2B. Further, after jointing and shaping of the solder bump 6 are finished, the semiconductor wafer 1 is unloaded to the outside by opening the gate valve 12 via the semiconductor device carrying chamber 10.

A coil heater or an infrared lamp heater in the sixth embodiment described later may be employed instead of the heat transfer heater 11c. These heaters are positioned on or under the heating table 11a or at any position over or below the heating table 11a. In other words, since an object heated/melted by the heating/melting process equipment according to the second embodiment is the solder bump 6 on the semiconductor wafer 1, any position may be employed if such position is enough to joint the solder bump 6 onto the connected material 5 shown in FIG. 2A.

Third Embodiment

In a third embodiment of the present invention, a following configuration is employed as a mechanism for introducing the formic or other carboxylic acid containing gas into the heating/melting chamber 11.

Figure 5:
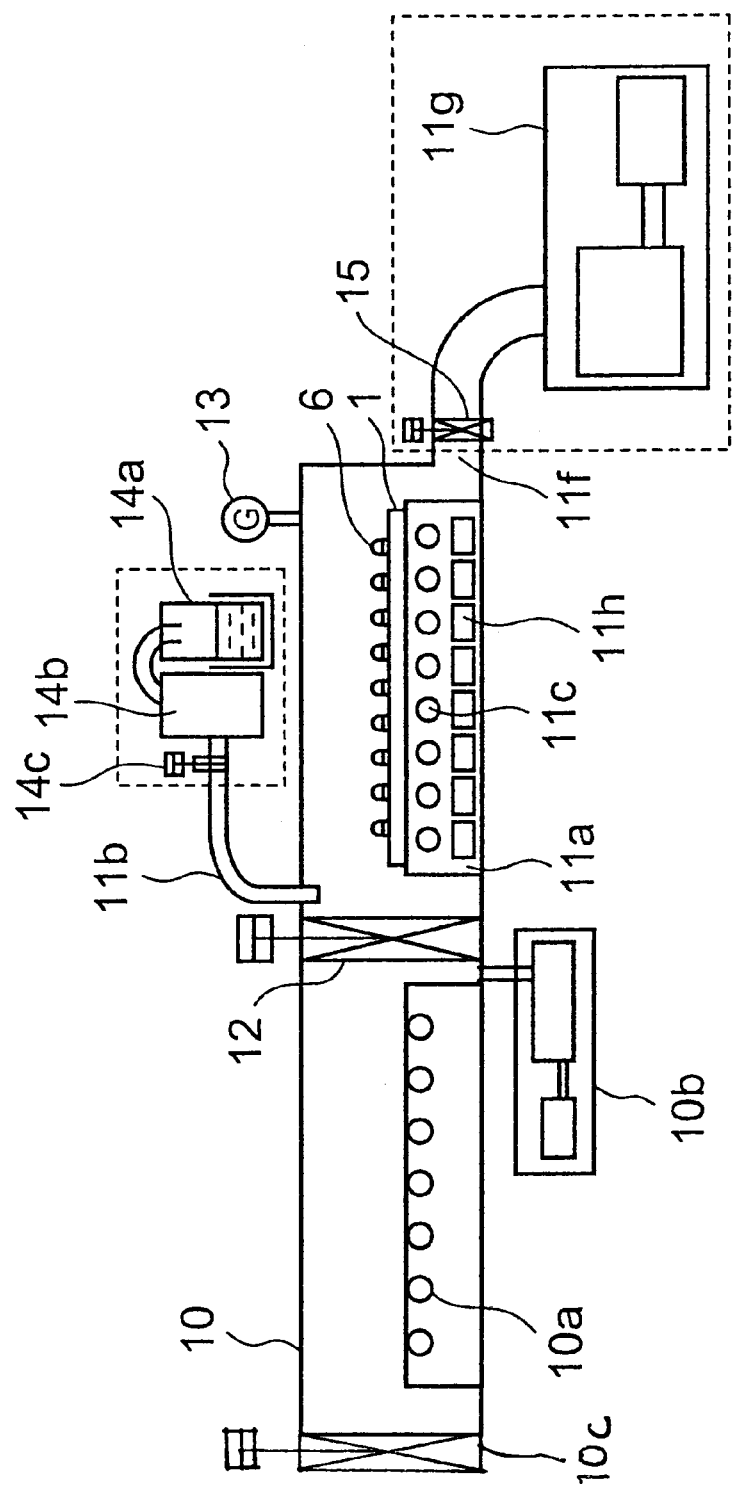
FIG. 5 is a view showing a configuration of a heating/melting process equipment used to heat/melt the solder bump in a semiconductor device according to a third embodiment of the present invention.

More particularly, as shown in FIG. 5, such a configuration is employed that the carboxylic acid containing solution is evaporated in a solution evaporating apparatus like a thermostat and then the evaporated carboxylic acid containing gas is introduced into the heating/melting chamber 11 via a gas pressure adjusting portion 14b, a gas flow rate adjusting valve 14c, and a gas introducing pipe 11b.

Since liquid material can be used by employing such configuration, a cost can be reduced. In addition, a uniform gas pressure can be obtained by the gas pressure adjusting portion 14b. Furthermore, the pressure in the heating/melting chamber 11 can be severely managed by the gas flow rate adjusting valve 14c together with the pressure gauge 13, and thus the safety of working can be enhanced.

Besides, as shown in FIG. 5, if a pressure adjusting mechanism 15 is provided between the exhausting apparatus 11g and the heating/melting chamber 11, a necessary internal pressure can be obtained while suppressing a gas introducing amount into the inside of the heating/melting chamber 11. Thus, such pressure adjusting mechanism 15 is effective for suppressing a consumed amount of the carboxylic acid containing solution.

In this case, in FIG. 5, the same references as those shown in FIG. 4 denote the same elements.

Fourth Embodiment

Figure 6:
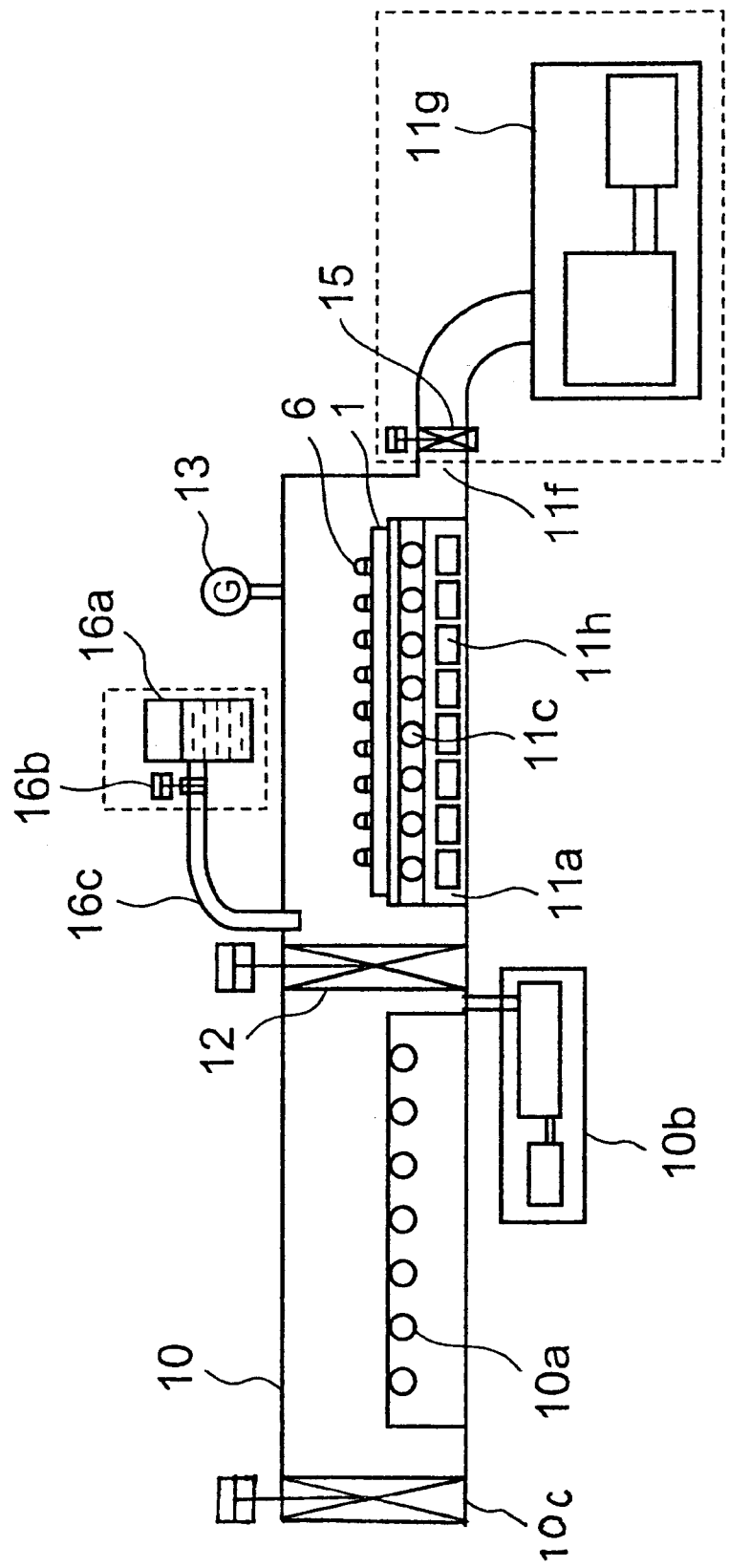
FIG. 6 is a view showing a configuration of a heating/melting process equipment used to heat/melt the solder bump in a semiconductor device according to a fourth embodiment of the present invention.

In the second and third embodiments, the evaporated carboxylic acid containing material is introduced into the heating/melting chamber 11. However, as shown in FIG. 6, the liquid carboxylic acid or the carboxylic acid containing material may be introduced into the heating/melting chamber 11. It is desirable that the formic acid is employed as the carboxylic acid.

In FIG. 6, the carboxylic acid solution or the carboxylic acid containing solution is stored in a solution container 16a that is arranged on the outside of the heating/melting chamber 11. Then, a liquid supplying port of the solution container 16a is connected to a top portion of the heating/melting chamber 11 via a liquid flow rate adjusting valve 16b and a solution/mist introducing pipe 16c.

In this case, in FIG. 6, the same references as those shown in FIG. 4 and FIG. 5 denote the same elements.

According to the above liquid supplying mechanism, the carboxylic acid in the solution container 16a is introduced into the heating/melting chamber 11 via the solution/mist introducing pipe 16c. Then, since the interior of the heating/melting chamber 11 is heated and the pressure therein is reduced, the liquid carboxylic acid can be evaporated instantly and can be spread into the heating/melting chamber 11.

Also, the liquid flow rate adjusting valve 16b can suppress the excessive supply of the liquid into the heating/melting chamber 11, and thus can suppress the pressure in the heating/melting chamber 11 at a constant value.

Fifth Embodiment

Figure 7:
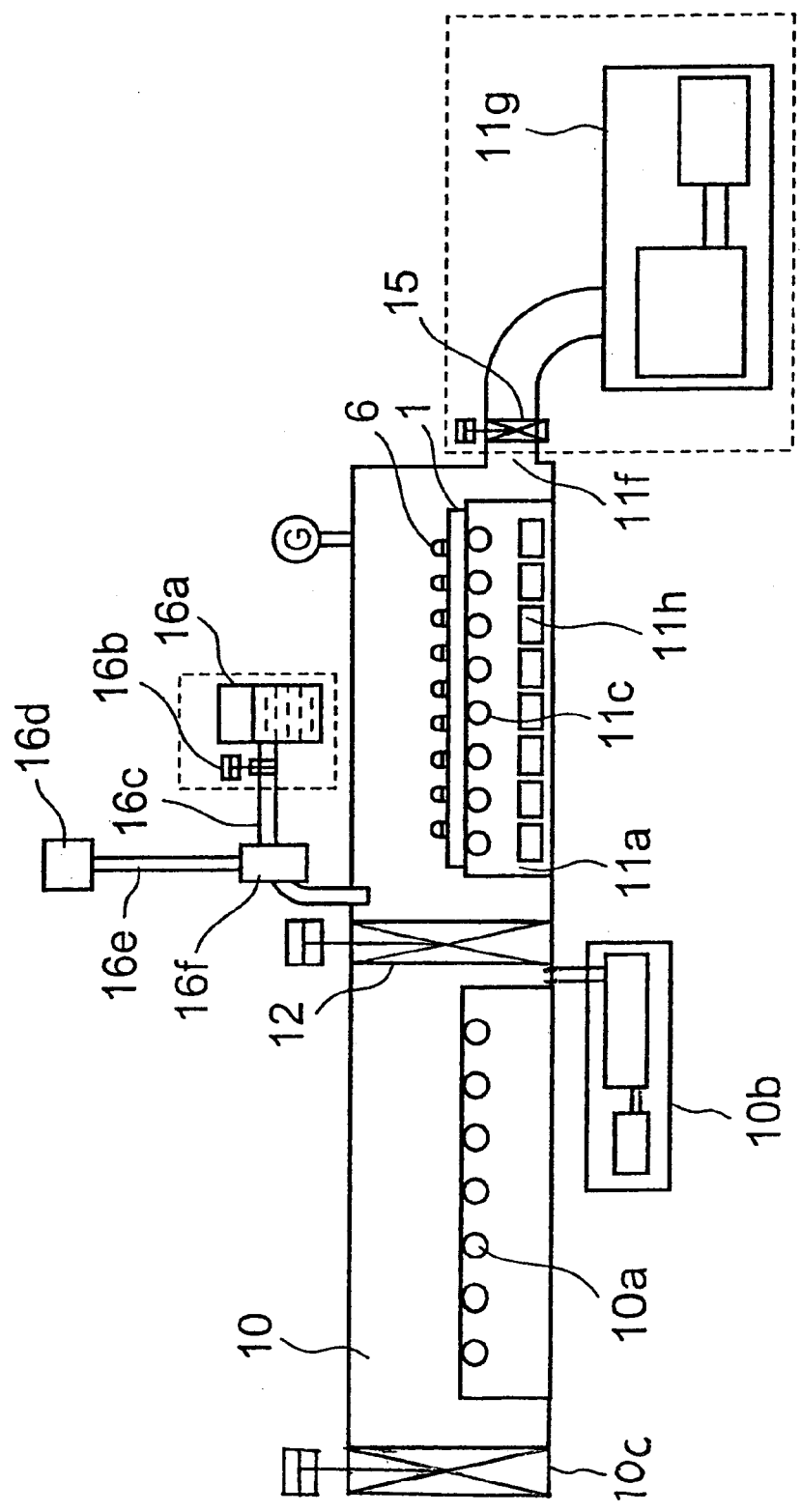
FIG. 7 is a view showing a configuration of a heating/melting process equipment used to heat/melt the solder bump in a semiconductor device according to a fifth embodiment of the present invention.

In the configuration shown in the fourth embodiment, a configuration shown in FIG. 7 is employed if an inert gas is introduced into the heating/melting chamber 11. In this case, in FIG. 7, the same references as those shown in FIG. 4 to FIG. 6 denote the same elements.

In FIG. 7, an inert gas supplying source 16d is arranged on the outside of the heating/melting chamber 11, and this inert gas supplying source 16d is connected to a mixing portion 16f via an inert gas introducing pipe 16e. This mixing portion 16f is fitted in the middle of a solution/mist introducing pipe 16c. The inert gas such as nitrogen, argon, helium, xenon, or the like, for example, is sealed in the inert gas supplying source 16d.

According to the above configuration, the carboxylic acid solution supplied from the solution container 16a and the inert gas supplied from the inert gas supplying source 16d are mixed in the mixing portion 16f respectively to then form the mist. The mist is sprayed into the heating/melting chamber 11 via the solution/mist introducing pipe 16c. Then, because the interior of the heating/melting chamber 11 is heated and pressure-reduced, the mist is evaporated to diffuse into the interior.

Such configuration is effective for the case where the partial pressure of the carboxylic acid gas such as formic acid gas should be reduced.

Sixth Embodiment

Figure 8:
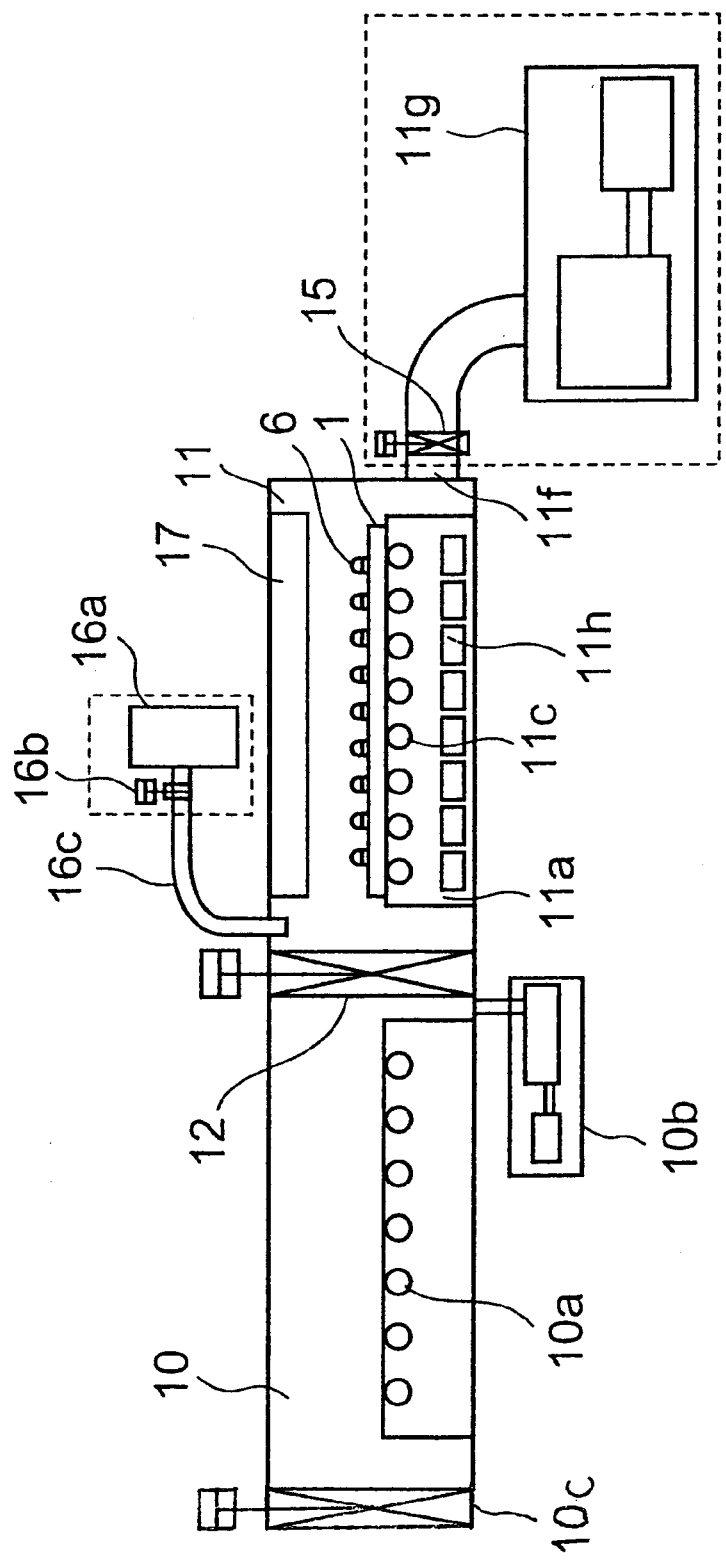
FIG. 8 is a view showing a configuration of a heating/melting process equipment used to heat/melt the solder bump in a semiconductor device according to a sixth embodiment of the present invention.

In the fourth embodiment, the infrared lamp heater may be employed as the heating means. As shown in FIG. 8, for example, an infrared lamp heater 17 is arranged over the heating/melting chamber 11 so as to oppose to the semiconductor wafer 1.

If the infrared heating is employed, the solder bump 6 can be heated in a shorter time than the heat transfer type and thus a processing time can be shortened.

In FIG. 7, the infrared lamp heater 17 is arranged over the semiconductor wafer 1. However, even if the infrared lamp heater 17 is arranged below the semiconductor wafer 1, the similar advantages can be achieved. Also, the temperature profile can be strictly managed by employing the infrared lamp heater 17 together with the cooling module 11h, like the first embodiment.

In this case, the same configuration as those in the second and third embodiments may be used as the gas supplying means.

Seventh Embodiment

Figure 9:
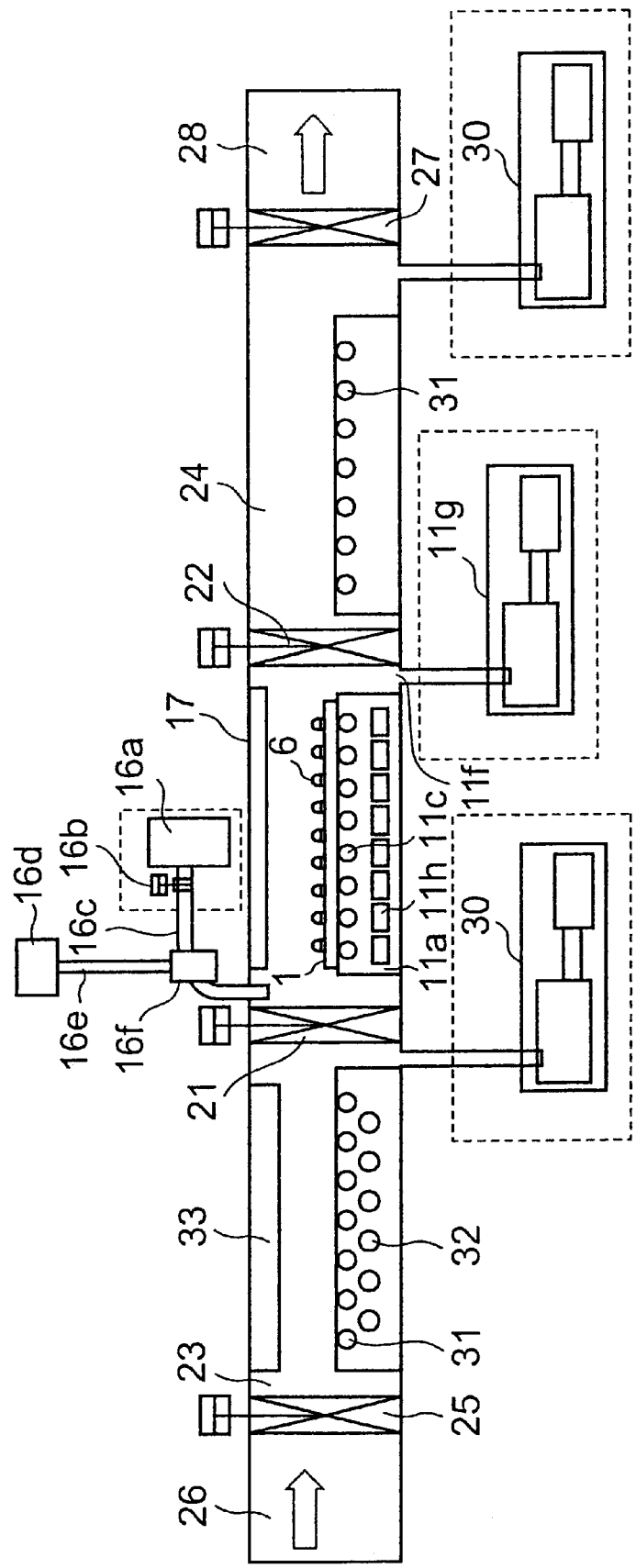
FIG. 9 is a view showing a configuration of a heating/melting process equipment used to heat/melt the solder bump in a semiconductor device according to a seventh embodiment of the present invention.

FIG. 9 is a view showing a configuration of a heating/melting process equipment according to a seventh embodiment of the present invention. The same references as those in FIG. 4 to FIG. 8 denote the same elements.

In FIG. 9, a first preliminary exhaust chamber 23 and a second preliminary exhaust chamber 24 are positioned adjacent to substrate carrying ports of the heating/melting chamber 11 shown in the second embodiment via a first gate valve 21 and a second gate valve 22 respectively. In addition, a loading chamber 26 is positioned adjacent to the first preliminary exhaust chamber 23 via a third gate valve 25, and an unloading chamber 28 is positioned adjacent to the second preliminary exhaust chamber 24 via a fourth gate valve 27.

An exhausting apparatus 30 is connected to the first preliminary exhaust chamber 23 and the second preliminary exhaust chamber 24 respectively to reduce the pressure in the first preliminary exhaust chamber 23 and the second preliminary exhaust chamber 24 into a predetermined pressure. Also, a carrying chamber 31 is fitted to the first preliminary exhaust chamber 23 and the second preliminary exhaust chamber 24 respectively. Preliminary heating mechanisms 32, 33 for preliminarily heating the semiconductor wafer 1 are arranged over and below the carrying chamber 31 in the first preliminary exhaust chamber 23 respectively to shorten a rise time in heating the heated object (substrate, wafer) in the heating/melting chamber 11. The preliminary heating mechanisms 32, 33 may be formed of the infrared lamp heater, the heat transfer heater, or the coil heater, like the above embodiments.

In the equipment having the above configuration, the semiconductor wafer 1 put into the loading chamber 26 is loaded onto the carrying chamber 31 in the first preliminary exhaust chamber 23 through the third gate valve 25. Then, the semiconductor wafer 1 is preliminarily heated by the preliminary heating mechanisms 32, 33 in the first preliminary exhaust chamber 23, and simultaneously the interior of the first preliminary exhaust chamber 23 is pressure-reduced up to the predetermined pressure by the exhausting apparatus 30. The heating temperature in this case is set to a temperature at which the solder bump 6 does not melt.

After this, the first gate valve 21 is opened and then the semiconductor wafer 1 is transferred to the heating table 11a in the heating/melting chamber 11 by the carrying mechanism 31.

The inside of the heating/melting chamber 11 is pressure-reduced up to the predetermined pressure by the exhausting apparatus 11g under the condition that the first gate valve 21 and the second gate valve 22 are closed. Then, in the situation that the carboxylic acid gas or the carboxylic-acid containing gas has been introduced into the heating/melting chamber 11, the semiconductor wafer 1 and the solder bump 6 are heated by the heaters 11c, 17 so as to connect the solder bump 6 to the underlying metal film 5, as shown in FIG. 2A, and to reflow the solder bump 6. The connection/reflow conditions of the solder bump 6 are set in compliance with the first embodiment.

After the jointing/formation of such solder bump 6 have been finished, the heating of the solder bump 6 is stopped to lower the temperature below the melting point. Then, the second gate valve 22 is opened, then the semiconductor wafer 1 is carried from the heating/melting chamber 11 to the second preliminary exhaust chamber 24 whose internal pressure is lowered, and then the second gate valve 22 is closed. Then, the temperature of the semiconductor wafer 1 is lowered to the predetermined temperature in the second preliminary exhaust chamber 24 and then unloaded to the unloading chamber 28 by opening the fourth gate valve 27.

As described above, since the carrying direction of the semiconductor wafer 1 is fixed in one direction, it is possible to successively supply the semiconductor wafer 1 to the heating/melting chamber 11, and thus the mass producibility of the solder bump formation can be increased.

Here, in FIG. 9, as the mechanism for introducing the carboxylic acid gas into the heating/melting chamber 11, the configuration used in the fourth embodiment, i.e., the configuration that comprises the solution container 16a in which the carboxylic acid solution or the like is stored, the liquid flow rate adjusting valve 16b, the solution/mist introducing pipe 16c, the inert gas supplying source 16d, the inert gas introducing pipe 16e, and the mixing portion 16f is used.

If there is no need to reduce the partial pressure of the carboxylic acid gas in such carboxylic acid gas supplying mechanism, the inert gas supplying source 16d, the inert gas introducing pipe 16e, and the mixing portion 16f may be omitted, as shown in the third embodiment. In this case, the carboxylic acid solution is instantly gasified when supplied into the heating/melting chamber 11.

Also, as the mechanism for introducing the carboxylic acid gas into the heating/melting chamber 11, the mechanism for introducing the carboxylic acid gas into the heating/melting chamber 11 from the gas supply source 11e via the gas introducing mechanism 11d and the gas introducing pipe 11b, as employed in the second embodiment.

It is desirable that the formic acid is employed as the carboxylic acid.

Eighth Embodiment

In the second to seventh embodiments, the formation of the solder bump is explained. In an eighth embodiment of the present invention, assembling of an electronic parts module will be explained hereunder.

Figure 10:
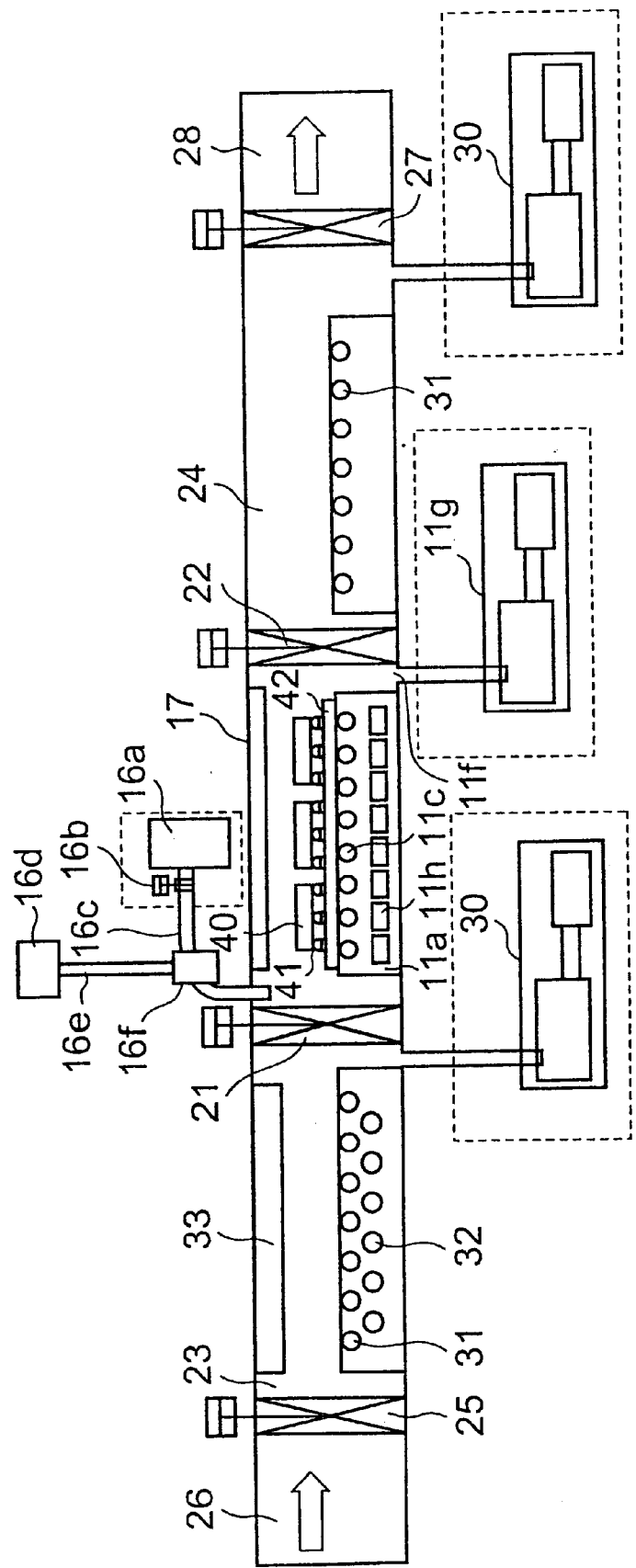
FIG. 10 is a view showing a configuration of an example of a heating/melting process equipment used to mounte an electronic parts module according to an eighth embodiment of the present invention.

As shown in FIG. 10, in the eighth embodiment, the heating/carrying apparatus having the same configuration as explained in the seventh embodiment is used.

Figure 11A:
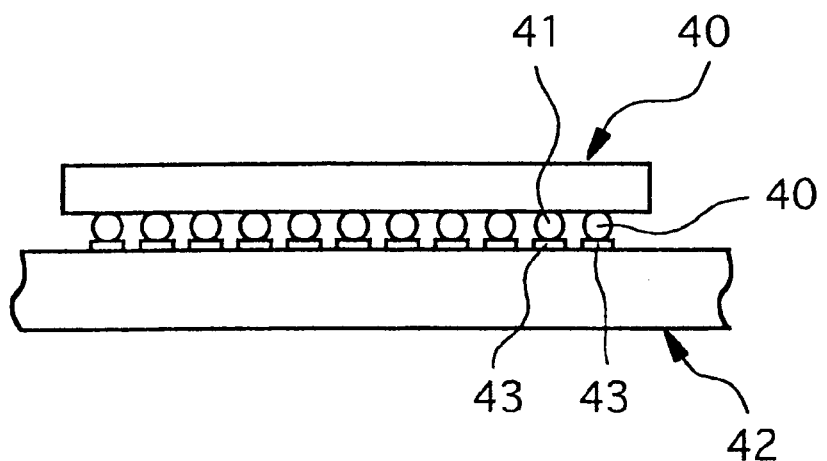
FIGS. 11A and 11B are sectional views showing electronic parts module mounting according to the eighth embodiment of the present invention.

First, as shown in FIG. 11A, an electronic parts 40 in which a plurality of solder bumps 41 are formed on one surface to project therefrom is used. This electronic parts 40 is mounted on a wiring substrate 42 to constitute an electronic parts module. In this case, the solder bumps 41 of the electronic parts 40 are positioned on wirings 43 which are formed of copper or gold on the wiring substrate 42.

As the electronic parts 40, there are a semiconductor device having the solder bump structure shown in FIG. 2C, a BGA (Ball Grid Array) mounting, and other devices. Also, as the wiring substrate 42, there are a ceramic wiring substrate, a print wiring substrate, a substrate consisting of insulating material whose heat resisting temperature is in excess of 200° C., and the like.

Then, the wirings 43 and the electronic parts 40 are put into the loading chamber 26 shown in FIG. 10 in the situation that the electronic parts 40 is mounted on the wiring substrate 42.

Then, the wiring substrate 42 and the electronic parts 40 are loaded on the carrying chamber 31 in the first preliminary exhaust chamber 23 via the third gate valve 23. Then, the wiring substrate 42 and the electronic parts 40 are preliminarily heated by the preliminary heating mechanisms 32, 33 in the first preliminary exhaust chamber 23, and also the pressure of the interior of the first preliminary exhaust chamber 23 is reduced to the predetermined pressure by the exhausting apparatus 30. The heating temperature in this case is set to a temperature at which the solder bumps 41 are not melted.

After this, the first gate valve 21 is opened, and then the wiring substrate 42 and the electronic parts 40 are trans- Accordingly, the assembling of the electronic parts module is finished.

The equipment for fitting the electronic parts onto the wiring substrate 42 is not limited to the configuration shown in FIG. 10. The equipment shown in FIG. 4 to FIG. 8 or the equipment shown in embodiments described later may be used.

TABLE 4

| (A) | (B) | (C) | (D) | (E) | (F) | (G) | (H) | (I) | (J) | (K) | (L) | (M) |
|---|---|---|---|---|---|---|---|---|---|---|---|---|
| 1 | Pb95:5Sn | Ni | 400 | — | 0.02 | — | — | — | 0 | (many voids) | ceramic substrate | polyimide |
| 2 | Pb95:5Sn | Ni | 350 | formic acid | 5 | Gas | — | before solder melting | 99.7 | <0.5 | ↑ | polyolefin |
| 3 | SnPb97:3Cu | ↑ | 300 | caproic acid | 10 | Gas | Ar | ↑ | 98 | <0.1 | ↑ | imido-polyimide |
| 4 | Sn96:Ag2.5:1.5Bi | ↑ | 280 | caprylic acid | 3 | Solu. | IPA | ↑ | 95 | <0.1 | ↑ | — |
| 5 | Pb95:5Sn | Au | 380 | formic acid | 15 | Gas | — | before solder melting | 100 | <0.1 | silicon substrate | benzocyclobutene |

(A): Sample
(B): Solder composition (atm ratio)
(C): Deposited material
(D): Heating peak temperature (° C.)
(E): Carboxylic acid seed
(F): Atmosphere pressure (Torr)
(G): Introducing mode
(H): Mixed gas
(I): Introducing timing
(J): Welded shape visual yield (%)
(K): Void occuring rate in the welded portion (%)
(L): Substrate material
(M): Insulating material ferred onto the heating table 11a in the heating/melting chamber 11 by using the carrying mechanism 31.

Figure 11B:
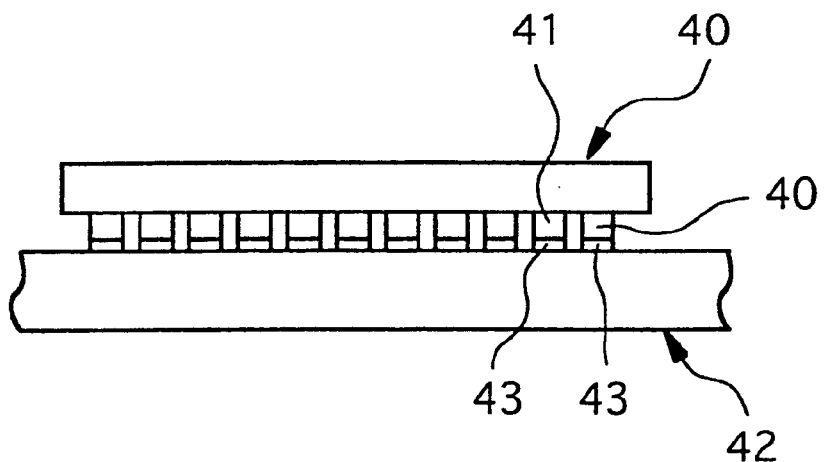

After the first gate valve 21 and the second gate valve 22 are closed, the inside of the heating/melting chamber 11 is pressure-reduced to the predetermined pressure by the exhausting apparatus 11g. Then, in the condition that at least the carboxylic acid gas such as formic acid gas is introduced, the solder bumps 41 and the wirings 43 are heated by the heaters 11c, 17 up to the temperature in excess of the melting point of the solder. Accordingly, as shown in FIG. 11B, the solder bumps 41 of the electronic parts 40 are connected to the wirings 43 on the wiring substrate 42 and such solder bumps 41 are reflown. In this case, since the oxides formed on the solder bumps 41 are removed by the atmosphere gas containing at least the carboxylic acid, the jointing the solder bumps 41 to the wirings 43 is stabilized. The gas generated at this time can be diffused quickly into the reduced pressure atmosphere and removed from the inside of the solder bumps 41. As a result, the soldered portion with no void can be obtained.

The jointing conditions between the solder bumps and the wirings are set to the same conditions as the formation of the solder bumps shown in the first embodiment.

After such jointing is finished, the second gate valve 22 is opened at a point of time when the temperature is below the melting point of the solder, then the wiring substrate 42 and the electronic parts 40 are carried from the heating/melting chamber 11 to the second preliminary exhaust chamber 24, and then the second gate valve 22 is closed. The temperature of the wiring substrate 42, to which the electronic parts 40 is connected via the solder bumps 41, is lowered to the predetermined temperature in the second preliminary exhaust chamber 24 and then the wiring substrate 42 is carried to the unloading chamber 28 by opening the fourth gate valve 27.

When the void occurring rate in the soldering portion and the outward appearance yield of solidified solder are examined while changing the presence of the carboxylic acid, type of the carboxylic acid, heating temperature, solder bump material, pressure, wiring substrate material, and insulating material after the wirings on the wiring substrate 42 is formed of nickel or copper, results given in Table 4 are derived. The insulating material is material constituting the insulating film 2 shown in FIG. 2C or the cover film 4, otherwise the insulating protection film 7 for covering the underlying metal film 5 extended from the opening 4a shown in FIG. 3. In this case, the solder bumps 6 are connected to the underlying metal film 5 via the opening formed in the insulating protection film 7. The structures shown in FIG. 2C and FIG. 3 correspond to the case the electronic parts 40 in FIG. 11A is the semiconductor device.

In this case, the generation of the voids was checked by the X-ray inspection.

According of the samples 2 to 5 in Table 4, it becomes apparent that, since the carboxylic acid is introduced, the yield of the solder bump solidified shape can be improved in contrast to the sample 1 in the prior art condition, and also the void occurring rate in the solder bump can be significantly reduced. Also, if the optimum carboxylic acid is selected and the optimum introducing conditions are set, the extremely high quality can be derived over the wide range of the solder composition. In addition, variations of these composition and conditions without departing the scope of the present invention can achieve the sufficient advantages.

Ninth Embodiment

After the solder (solder bump) is heated/melted by introducing the formic acid into the reduced pressure atmosphere as the carboxylic acid, in some cases a part of the formic acid is not decomposed by heating after the heating/melting of the solder and still remains in the reduced pressure atmosphere. Then, if the unreacted portion of the formic acid that does not contribute the reduction remains on the solder surface, sometimes such unreacted portion reoxidize the solder in the air.

Figure 12:
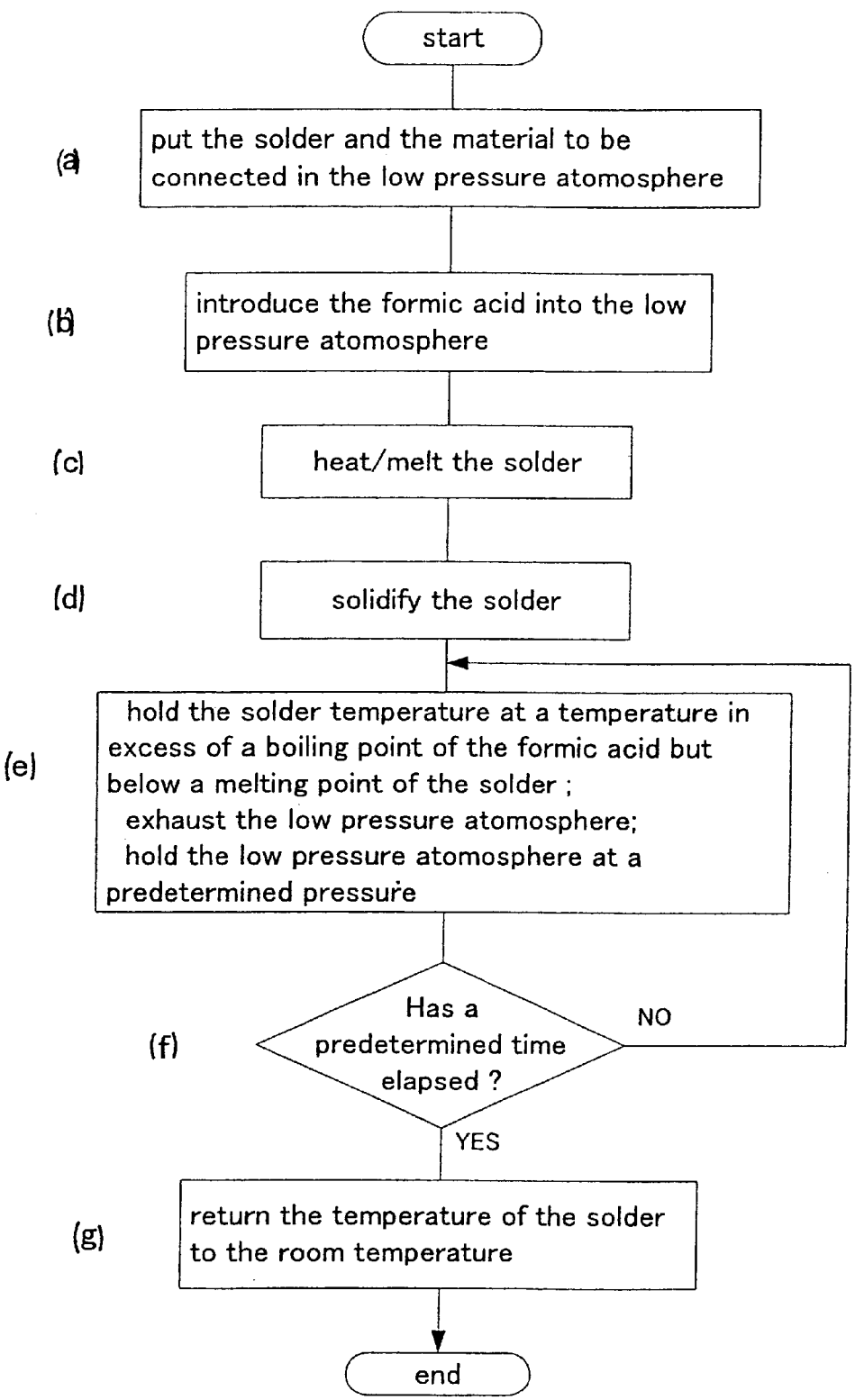
FIG. 12 is a flowchart showing steps of heating/melting the solder according to a ninth embodiment of the present invention.

In order to remove the unreacted portion of the formic acid from the solder surface, heating/melting process of the solder is performed in compliance with a flowchart shown in FIG. 12.

First, as shown in FIG. 2A, the solder bump 6 is formed on the underlying metal film (connected material) 5 on the silicon substrate 1. The solder bumps 6 are formed of solder material having any one composition of Pb95:Sn5, eutectic crystal Pb—Sn, and Sn-3.5Ag. Then, as shown in FIG. 2B, the silicon substrate 1 is put into the reduced pressure atmosphere. Accordingly, as shown in (a) of FIG. 12, the solder bumps 6 and the underlying metal film 5 are put into the reduced pressure atmosphere.

Then, as shown in (b), (c) of FIG. 12, the formic acid is introduced into the reduced pressure atmosphere, and then the solder is heated/melted at the temperature in excess of the melting point of the solder for several tens seconds. Thus, the solder bumps 6 are jointed to the underlying metal film 5 and also the solder bumps 6 are shaped, so that generation of the voids in the solder bumps 6 can be prevented.

Then, as shown in (d), (e) of FIG. 12, the heating temperature of the solder bumps 6 is reduced up to a temperature below the melting point of the solder but in excess of the boiling point of the formic acid to solidify the solder bumps 6, and then such temperature is held. The exhaust of the reduced pressure atmosphere is continued during when this temperature is held. The pressure of the formic acid in the reduced pressure atmosphere is reduced gradually by such exhaust, and thus the formic acid adhered onto the surface of the solder bumps 6 and the surface of the cover film 4 around the solder bumps 6 is evaporated. As a result, the formic acid can be substantially removed from the solder bumps 6 and the cover film 4.

Then, as shown in (f), (g) of FIG. 12, the temperature of the solder bumps 6 is held at a temperature less than the melting point of the solder but more than the boiling point of the formic acid for the predetermined time, then the temperature of the solder bumps 6 is lowered below the boiling point of the formic acid, e.g., the room temperature, and then the silicon substrate 1 is taken out from the reduced pressure atmosphere.

According to the above steps, reoxidation of the solder bumps 6 jointed to the connected material 5 never occurred.

After the solder was heated/melted as above, the solder whose temperature is lowered to the room temperature in the reduced pressure atmosphere, the solder whose temperature is kept at the temperature of 110° C. after about 6 minutes elapsed, and the solder whose temperature is kept at the temperature of 200° C. after about 4 minutes elapsed were taken out from the reduced pressure atmosphere into the atmosphere respectively, and then these solders were left in the air for one week as they are. Then, the oxidation states of the surfaces of the solders that have been received different temperature treatment after the heating/melting were examined every solder. At the time of this examination, the influence of the difference depending on whether or not the reduced pressure atmosphere is exhausted after the solder is heated/melted upon the oxidation of the solder and the influence of the change in pressure in the reduced pressure atmosphere after the solder is heated/melted upon the oxidation of the solder were also examined.

TABLE 5

| (A) | (B) | (C) | (D) | (E) |
|---|---|---|---|---|
| pb95:Sn5 | R.T. (not held) | 10 | Yes | Occurred |
|  | R.T. (not held) | 1500 | No | Occurred |
|  | 110 | 1500 | Yes | Not Occured |
|  | 110 | 1500 | No | Occurred |
|  | 200 | 10 | Yes | Not Occured |
|  | 200 | 10 | No | Occurred |
| Sn-3.5Ag | R.T. (not held) | 10 | Yes | Occurred |
|  | 110 | 1500 | Yes | Not Occured |
|  | 110 | 1500 | No | Occurred |
| Eutectic | R.T. (not held) | 1500 | No | Occurred |
| Pb-Sn | 110 | 1500 | Yes | Not Occured |
|  | 200 | 10 | Yes | Not Occured |

(A): Solder composition
(B): Held temperature (° C.)
(C): Held pressure (Pa)
(D): Exhaust
(E): Reoxidation According to Table 5, the surface of the solder, that is cooled to the room temperature until the solder is taken out into the atmosphere after the solder is solidified, was oxidized after one week lapsed. In contrast, no oxidation was found on the surface of the solder that is kept at the temperature of more than 110° C. within the predetermined time after one week lapsed. The reason for this may be supposed such that the formic acid stuck on the surface of the solder is evaporated by the heating performed after the solder has been solidified. Since the boiling point of the formic acid in the atmosphere is around 101° C., the held temperature of the solder must be set higher than this boiling point. Also, since the boiling point of the formic acid is lowered in the reduced pressure atmosphere, the formic acid can be removed if the temperature is higher than the boiling point in the reduced pressure atmosphere. In this case, the held time must be set longer as the temperature is closer to the boiling point.

Also, according to Table 5, in the case that the temperature of the solder is held to exceed the boiling point of the formic acid after the solder has been solidified, the surface of the solder is ready to oxidize thereafter according to the purity of the gas mixed into the reduced pressure atmosphere if the pressure in the reduced pressure atmosphere is set high. Therefore, it is preferable that the reduced pressure atmosphere should be controlled below 1500 Pa after the solder has been solidified. In addition, according to Table 5, the temperature is held in excess of the boiling point of the formic acid without the exhaust of the gas in the reduced pressure atmosphere after the solder has been solidified, the surface of the solder is ready to oxidize thereafter. Therefore, it is preferable that the reduced pressure atmosphere should be brought into the exhausting condition at the time of heating after the solder has been solidified.

The above method may be applied to not only the case where the solder is jointed to the metal surface on the silicon substrate but also the case where the solder layer formed on the electronic parts is jointed to the wirings on the wiring substrate.

Tenth Embodiment

In the case that the solder layer is heated/melted to be jointed to the metal surface, the gas enters into the solder layer because of either the nonwetting due to unremoval of the oxidized layer on the metal surface or the gas generated during the soldering. Thus, if such gas remains in the solder layer, the voids are generated to cause the defective jointing between the solder layer and the metal surface. Also, in some cases the voids generated in the solder layer still remain after the solder layer and the metal are solidified. Such generation of the voids can be prevented by heating/melting the solder layer in the reduced pressure atmosphere containing the formic acid. However, when the gas is escaped from the melted solder layer, rarely a part of the solder is scattered or defective formation of the solder is caused.

Figure 13:
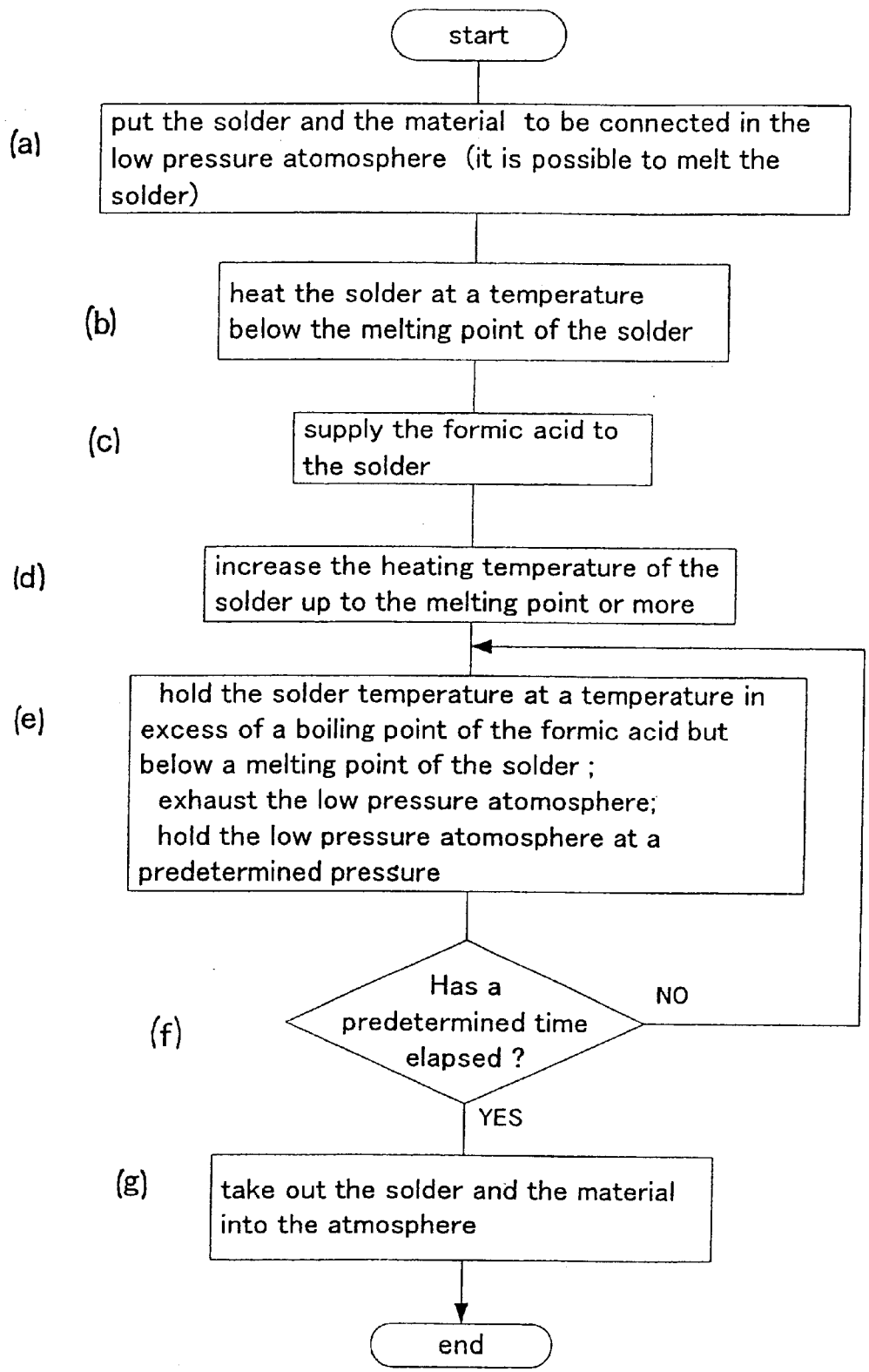
FIG. 13 is a flowchart showing steps of heating/melting the solder according to a tenth embodiment of the present invention.

In order to prevent the scattering of the solder or the defective formation of the solder, the heating/melting process of the solder is carried out in compliance with a flowchart shown in FIG. 13.

First, as shown in FIG. 2A, the solder bumps 6 are formed on the underlying metal film (connected material) 5 on the silicon substrate 1. The solder bumps 6 are formed of solder material that has any one composition of Pb95:Sn5, eutectic Pb—Sn, and Sn-3.5Ag. Then, as shown in FIG. 2B, the silicon substrate 1 is put into the reduced pressure atmosphere. Hence, as shown in (a) of FIG. 13, the solder bumps 6 and the underlying metal film 5 are put into the reduced pressure atmosphere.

Then, as shown in (b), (c) of FIG. 13, the solder bumps 6 are heated at the temperature below the melting point of the solder, e.g., the temperature lower than the melting point of the solder by 20 to 40° C. Then, the formic acid is supplied to the solder bumps 6 in this heating state.

Then, as shown in (d) of FIG. 13, the heating temperature of the solder bumps 6 is increased up to the melting point of the solder or more. In the middle of the temperature increase, the oxidized layer on the surface of the solder bumps 6 is gradually removed and also the gas generated or existing in the solder bumps 6 is gradually degassed. Accordingly, both the scattering of the solder bumps 6 or the defective formation of the solder bumps 6 are not caused.

After this, as shown in (e), (f) of FIG. 13, while exhausting the gas in the reduced pressure atmosphere, the heating temperature of the solder bumps 6 is lowered to a temperature range below the melting point of the solder and in excess of the boiling point of the formic acid. Then, the temperature is held for a predetermined time, the formic acid on the surface of the solder bumps 6 is removed and the surface is difficult to be oxidized thereafter.

Then, as shown in (g) of FIG. 13, the temperature of the solder bumps 6 is lowered to the room temperature, and then the silicon substrate 1 is taken out from the reduced pressure atmosphere.

As described above, an optimum timing of introducing the formic acid is not the middle of solder melting but the state in which the solder is being heated at a temperature lower than the melting point of the solder by several tens degree before the solder is melted. Then, the solder and the metal surface are jointed normally by increasing gradually the temperature of the solder up to the melting point of the solder or more after the formic acid is introduced.

TABLE 6

| (A) | (B) | (C) | (D) | (E) |
|---|---|---|---|---|
| Pb95:Sn5 | 280(m.p. −40) | 200/10 | Yes | <0.05 |
|  | 320(m.p.) | ↑ | Yes | 28 |
|  | 340(m.p. +20) | ↑ | Yes | 18 |
| Sn-3.5Ag | 200(m.p. −25) | 130/10 | Yes | <0.05 |
|  | 225(m.p.) | ↑ | Yes | 30 |
|  | 250(m.p. +25) | ↑ | Yes | 27 |

(A): Solder composition
(B): Formic acid introducing temperature (° C.)
(C): Held conditions (° C./Pa)
(D): Exhaust
(E): Void occurring rate (%) in the bump For this reason, when the proper temperature of the solder in introducing the formic acid was examined, results given in Table 6 have been derived. According to Table 6, in that case that the formic acid is supplied to the solder layer in the condition that the solder layer is heated at the temperature of the melting point (m.p.) of the solder or more, when the solder is held at the temperature of more than the boiling point of the formic acid but below the melting point of the solder and the reduced pressure atmosphere is set low such as 10 Pa by exhausting the reduced pressure atmosphere, the void occurring rate in the solder is increased. The void in this case is due to the defective shape of the solder.

As a result, it becomes apparent that yield of the solder shape is changed at the introducing timing of the formic acid and thus the void occurring rate can be largely reduced if the formic acid is introduced before the solder is melted. Although a mixed gas of the formic acid and the nitrogen gas is sprayed in the experiment in Table 6, an inert gas such as argon, helium, xenon, or the like may be used in place of the nitrogen. Also, only the formic acid may be introduced into the reduced pressure atmosphere. In addition, the solvent, e.g., ethanol, whose boiling point is lower than the held temperature after the solder is solidified may be evaporated to mix into the formic acid and introduced into the reduced pressure atmosphere.

Also, in the case that a number of voids are contained in the solder layer before the melting, for example, if the solder layer is formed by the plating method, etc., the voids can be suppressed effectively one step if the solder layer is jointed to the metal surface in compliance with flows shown in FIG. 13 after the voids are removed once by melting the solder layer before the formic acid is introduced and then the temperature of the solder layer is lowered below the melting point.

Further, if the solder layer is temporarily stuck onto the metal layer by the printing method, the jointing between the solder layer and the metal layer in compliance with the flows shown in FIG. 13 is effective. In this case, if the flux is added to the printing paste, the solder layer must be cleaned before the melting. Therefore, if the solder layer is formed of the printing method, preferably the printing paste that does not use the flux should be used.

The above method may be applied to not only the case where the solder is jointed to the metal surface on the silicon substrate but also the case where the solder layer formed on the electronic parts is jointed to the wirings on the wiring substrate.

Eleventh Embodiment

Since the formic acid has high metal corrosiveness, there is a possibility that such formic acid corrodes a gas introducing pipe, an exhaust pipe, etc. connected to the heating/melting chamber, etc. shown in the second embodiment to the eighth embodiment. Also, since the formic acid is solidified at the room temperature, it is not preferable to discharge the formic acid from the exhausting pump into the air as it is. In addition, if the formic acid is supplied ununiformly to the substrate or the solder layer, shapes of a plurality of solder layers are varied.

Therefore, a heating/melting process equipment having various mechanisms that can prevent such corrosion by the formic acid, suppress the discharge of the formic acid into the air, and supply uniformly the formic acid onto the substrate will be explained hereunder.

Figure 14:
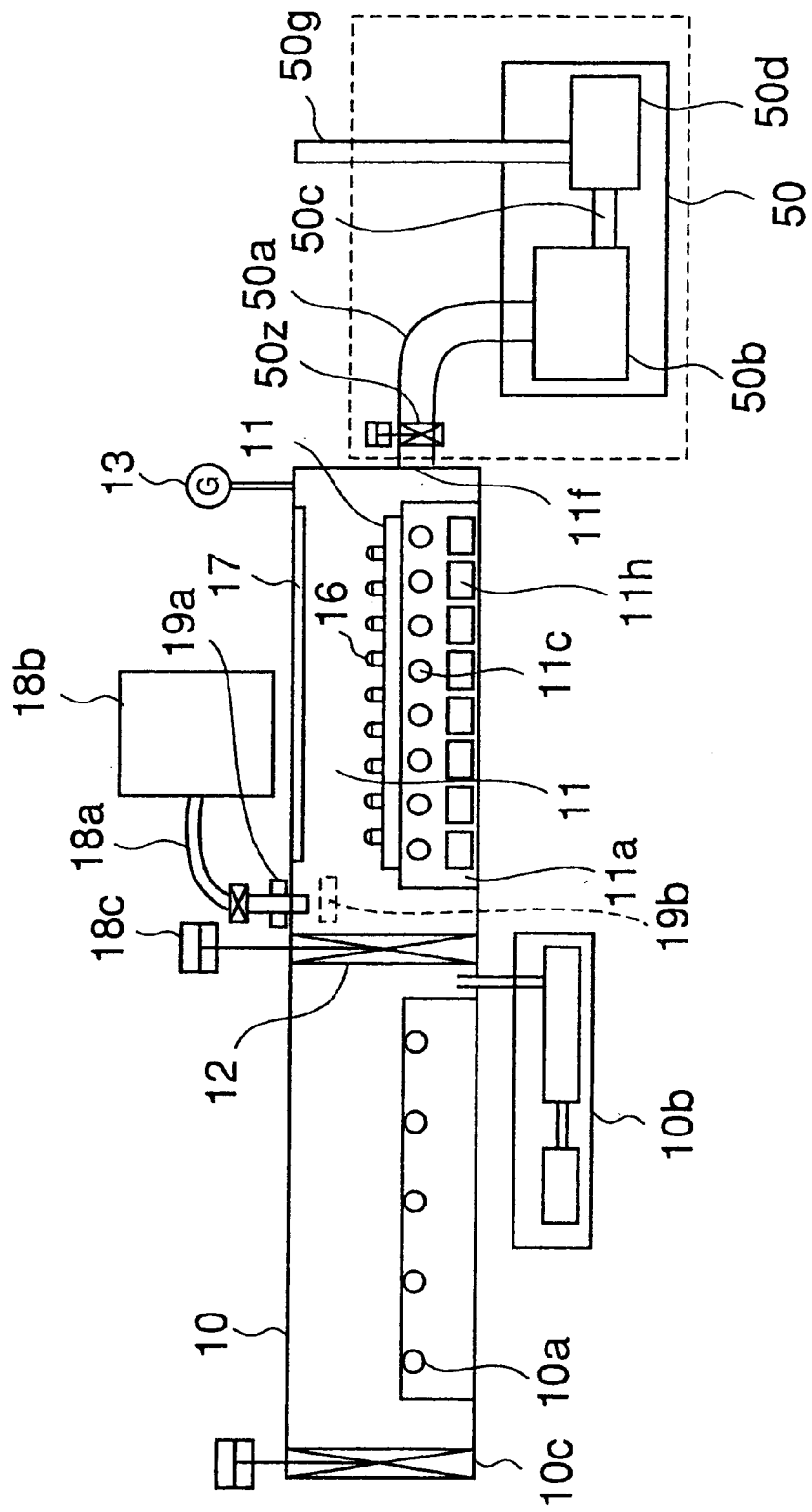
FIG. 14 is a view showing a configuration of a first example of a heating/melting process equipment used to heat/melt the solder according to an eleventh embodiment of the present invention.

FIG. 14 is a view showing a configuration of a heating/melting process equipment according to an eleventh embodiment of the present invention. In FIG. 14, the same references as those in FIG. 4 denote the same elements.

Like the second embodiment, the heating/melting process equipment shown in FIG. 14 comprises a semiconductor device carrying chamber 10 for carrying the semiconductor wafer 1 and a heating/melting chamber 11 for heating the solder bumps 6 on the semiconductor wafer 1. The semiconductor device carrying chamber 10 and the heating/melting chamber 11 are connected via a gate valve 12. A gas introducing pipe 18a which is formed entirely of SUS304 stainless steel or whose inner surface is Teflon-processed is connected to the heating/melting chamber 11. The gas introducing pipe 18a is connected to a gas supplying mechanism 18b on the outside of the heating/melting chamber 11. The formic gas or the formic gas containing gas supplied from the gas supplying mechanism 18b is introduced into the reduced pressure atmosphere in gas introducing pipe 18a via the gas introducing pipe 18a. A flow rate of the gas passing through the gas introducing pipe 18a is adjusted by a mass flow controller 18c.

Also, a heater 19c is provided in the neighborhood of the gas introducing pipe 18a to prevent the liquefaction of the formic gas.

Figure 15A:
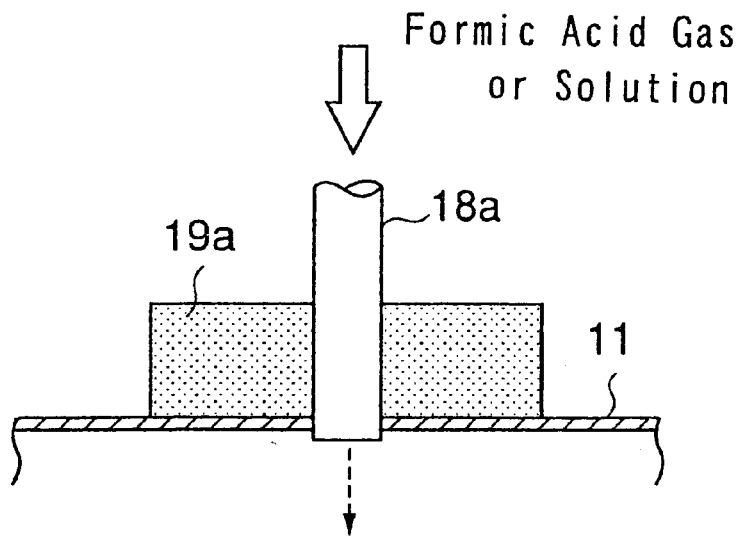
FIGS. 15A and 15B are side views showing a formic acid gas or formic acid solution heating mechanism in the heating/melting process equipment according to the eleventh embodiment of the present invention.

FIG. 15A shows a heating mechanism that heats the gas introducing pipe 18a by covering an outer periphery at an exhaust end of the gas introducing pipe 18a by the heater 19c.

Figure 15B:
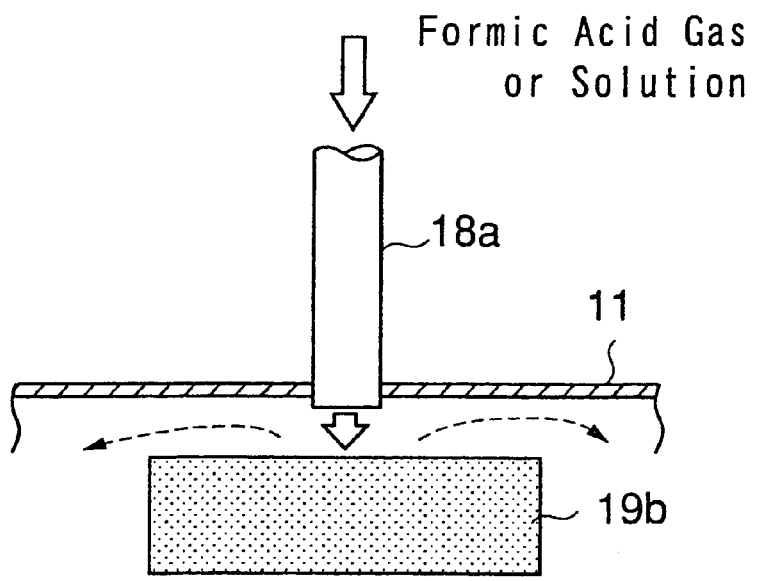

In order to prevent the liquefaction of the formic gas, as shown in FIG. 15B, a heater 19b is arranged at the top of the exhaust end of the gas introducing pipe 18a at a distance in place of the mechanism shown in FIG. 15A. This heater 19b heats the gas that is discharged from the gas introducing pipe 18a. According to this structure, the formic acid can be supplied uniformly to a plurality of solder bumps 6 on the semiconductor wafer 1 respectively by equalizing a distribution of the formic acid in the reduced pressure atmosphere in the heating/melting chamber 11. Since shapes of the solder bumps 6 after the heating/melting are formed equally if the formic acid can be supplied uniformly to a plurality of solder bumps 6, the yield of the jointing between the solder bumps 6 and the underlying metal layer 5, as shown in FIG. 2B, can be improved.

The formic acid passed over the semiconductor wafer 1 in the heating/melting chamber 11 is exhausted from an exhaust port 11f by an exhausting apparatus 50. The exhausting apparatus 50 comprises an exhausting pump 50b connected to an exhaust port 11f of the heating/melting chamber 11 via a first exhaust pipe 50a, and a formic acid recovering mechanism (carboxylic acid recovering mechanism) 50d connected to the exhaust side of the exhausting pump 50b via a second exhaust pipe 50c.

Figure 16:
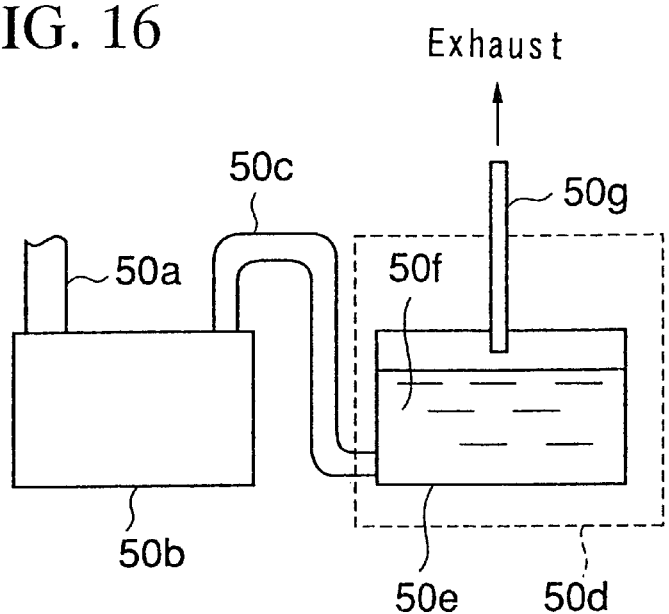
FIG. 16 is a view showing a configuration of a formic acid recovering mechanism in the heating/melting process equipment according to the eleventh embodiment of the present invention.

As shown in FIG. 16, for example, the formic acid recovering mechanism 50d has such a configuration that the second exhaust pipe 50c is inserted into a solution 50f in a solution container 50e and a third exhaust pipe 50g is connected to the top portion of the solution container 50e. As the solution 50f in the solution container 50e, water or alcohol into which the formic acid can be easily dissolved may be used.

According to the heating/melting process equipment having the above configuration, since respective inner surfaces of the gas introducing pipe 18a and the exhaust pipes 50a, 50c are formed of the stainless steel or the Teflon coating, they can have corrosion resistance for the formic acid and thus the maintenance of the process equipment can be facilitated.

Also, since the formic acid discharged from the exhausting pump 50b is dissolved into the solution 50f when it passes through the formic acid recovering mechanism 50d, a formic acid concentration of the gas that is exhausted into the air from the formic acid recovering mechanism 50d becomes extremely low.

In addition, since the heaters 18a, 18b are provided in the neighborhood of the exhaust end of the gas introducing pipe 18a, the formic acid can be evaporated again by the heaters 18a, 18b even if the formic acid being cooled and liquidized when it passes through the gas introducing pipe 18a exists slightly. Therefore, this heating/melting process equipment makes it possible not to leave the formic acid on the semiconductor wafer 1 and the solder bumps 6. The best effect can be expected when the setting temperature of the heaters 18a, 18b is in the range of 50 to 110° C. However, if the heating temperature by the heaters 18a, 18b is excessively increased, there is such a possibility that the liquidized formic acid is bumped to explode or the formic acid is decomposed, and therefore the card must be taken.

Like the second embodiment, the heating of the semiconductor wafer 1 or the solder bumps 6 may be carried out by not only the heat transfer heater 11c but also the infrared lamp heater 17 that is arranged over the heating/melting chamber 11 to perform the increase of the temperature. In case merely the heat transfer heater 11c is provided, it is difficult to perform the cooling quickly because its heat capacity is large. In contrast, in case the infrared lamp heater 17 is also provided to assist the heating in melting the solder bumps 6, it is possible to cool the solder bumps 6 quickly thereafter, for example, to cool below the melting point within one minute. In other words, the infrared lamp heater 17 is provided to improve the temperature controllability of the solder bumps 6.

In this case, a reference 50z in FIG. 14 denotes a pressure adjusting mechanism fitted to the first exhaust pipe 50a.

It is possible to suppress the diffusion of the formic acid into the air by providing the formic acid recovering mechanism 50d on the exhaust side of the exhaust pump 50b. However, if the formic acid stagnates in the exhaust pump 50b, the useful life of the exhaust pump 50b is shortened because the formic acid corrodes the exhaust pump 50b.

Several method of suppressing the corrosion of the exhaust pump 50b will be discussed in the following.

Figure 17A:
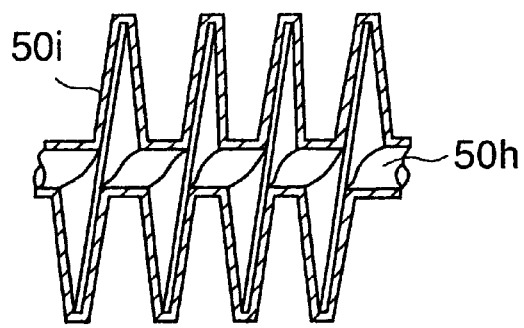
FIGS. 17A and 17B are views showing a configuration of a screw used in an exhaust pump in the heating/melting process equipment according to the eleventh embodiment of the present invention.

First, as a first method, an exhausting mechanism of the exhaust pump 50b, for example, as shown in FIG. 17A, a configuration in which Teflon 50i is coated on a surface of a screw 50h may be adopted.

Figure 17B:
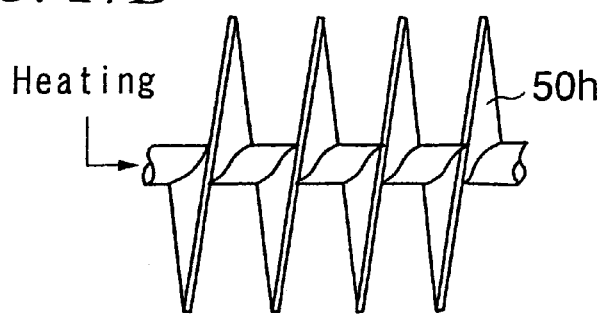

As a second method, as shown in FIG. 17B, a mechanism in which the screw 50h is heated at more than 110° C. not to stagnate the formic acid in the exhaust pump 50b may be adopted.

Figure 18:
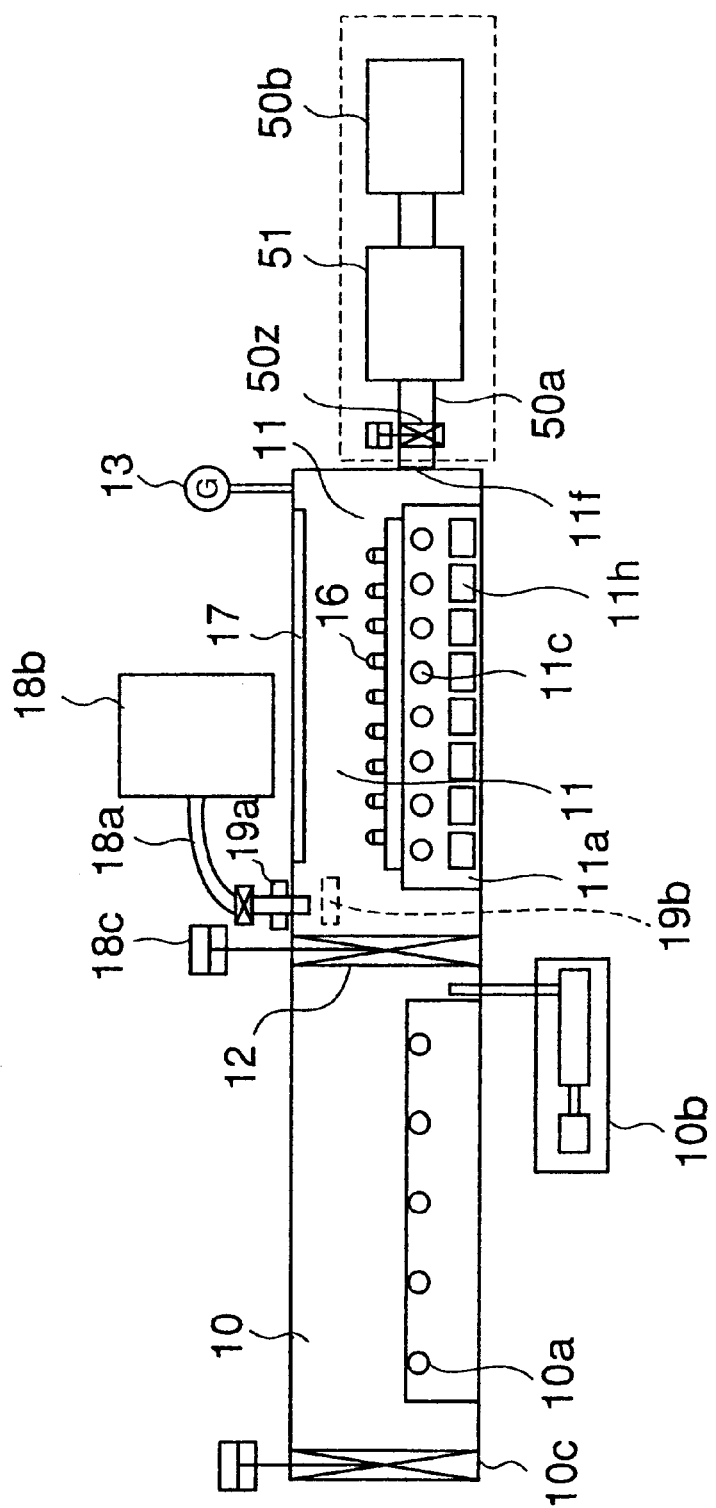
FIG. 18 is a view showing a configuration of a second example of a heating/melting process equipment used to heat/melt the solder according to the eleventh embodiment of the present invention.

As a third method, as shown in FIG. 18, a mechanism in which a formic acid decomposing mechanism 51 is provided between the exhaust port 11f of the heating/melting chamber 11 and the exhaust pump 50b may be adopted.

Figure 19A:
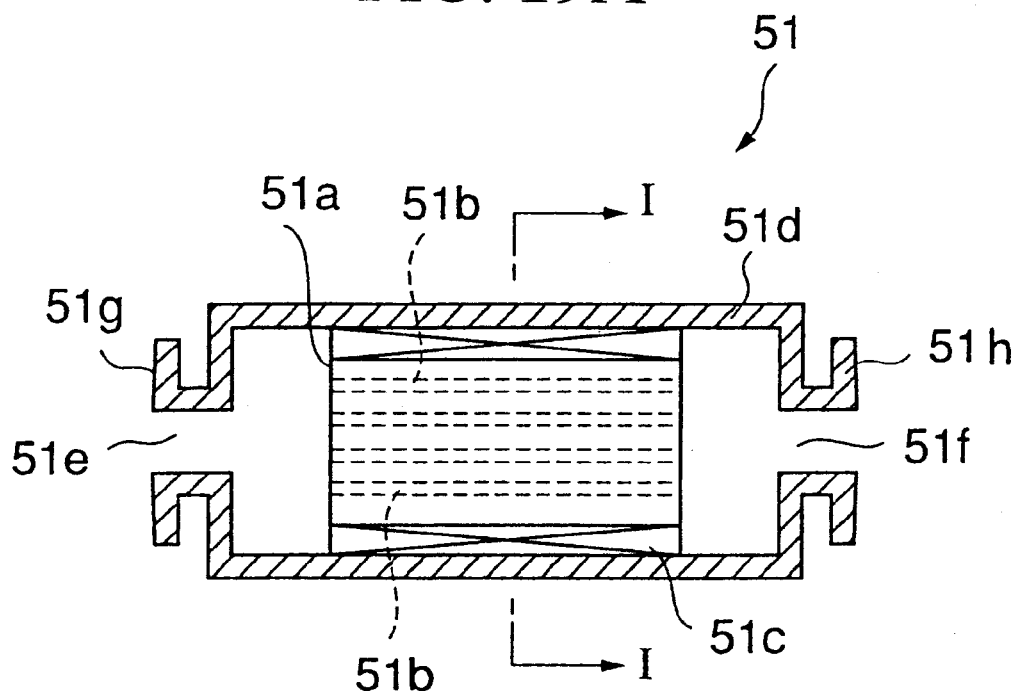
FIGS. 19A and 19B are views showing a configuration of another formic acid recovering mechanism used in the FIG. 20 is a view showing a configuration of a third example of a heating/melting process equipment used to heat/melt the solder according to the eleventh embodiment of the present invention.
Figure 19B:
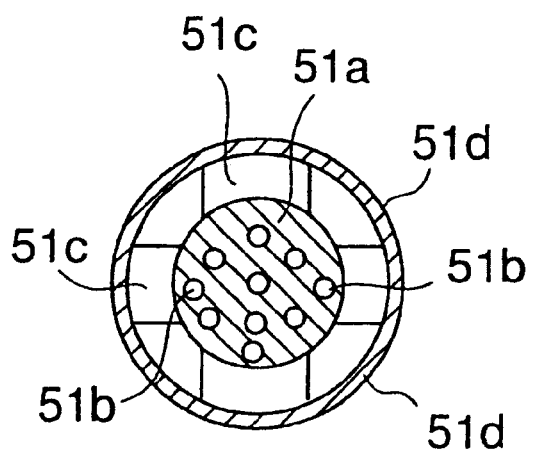

As shown in FIGS. 19A and 19B, the formic acid decomposing mechanism 51 has a cylindrical body 51a formed of SUS304 stainless steel. A plurality of through holes 51b are formed to extend along the axis direction of the cylindrical body 51a. Also, the cylindrical body 51a is installed into a cylindrical stainless housing 51d and surrounded by the heater 51c. A gas introducing port 51e and a gas exhaust port 51f are formed on both ends of the housing 51d to pass through the through holes 51c. Flanges 51g, 51h are formed on the outside of the gas introducing port 51e and the gas exhaust port 51f respectively. One flange 51g is connected to the first exhaust pipe 50a, and the other flange 51h is connected to the exhaust pump 50b. In this case, a plurality of thin stainless pipes that are bound may be arranged in parallel in lieu of a plurality of through holes 51b provided to the stainless cylindrical body 51a.

In such formic acid decomposing mechanism 51, the inside of the through holes in the stainless cylindrical body 51a is heated by the heater 51c up to 200 to 300° C. Then, the formic acid being discharged from the exhaust port 11f of the heating/melting chamber 11 is decomposed into water and carbon in passing through the through holes 51b and then exhausted to the exhaust pump 50b. Since the formic acid starts to decompose when it is heated to exceed 200° C., the exhausted gas loses the corrosiveness. Accordingly, in the process equipment shown in FIG. 18, the formic acid recovering mechanism is not connected to the exhaust pump 50b. However, in order to prevent the additional diffusion of the formic acid into the air, the formic acid recovering mechanism 50d shown in FIG. 16 may be provided to the exhaust side of the exhaust pump 50b.

By the way, in order to introduce the formic acid into the heating/melting chamber 11, the solution container 16a shown in the fourth embodiment may be connected to the heating/melting chamber 11 via the flow rate adjusting valve 16b and the solution/mist introducing pipe 16c, in place of the provision of the gas introducing pipe 18a and the gas supplying mechanism 18b shown in FIG. 14 and FIG. 18.

Figure 20:
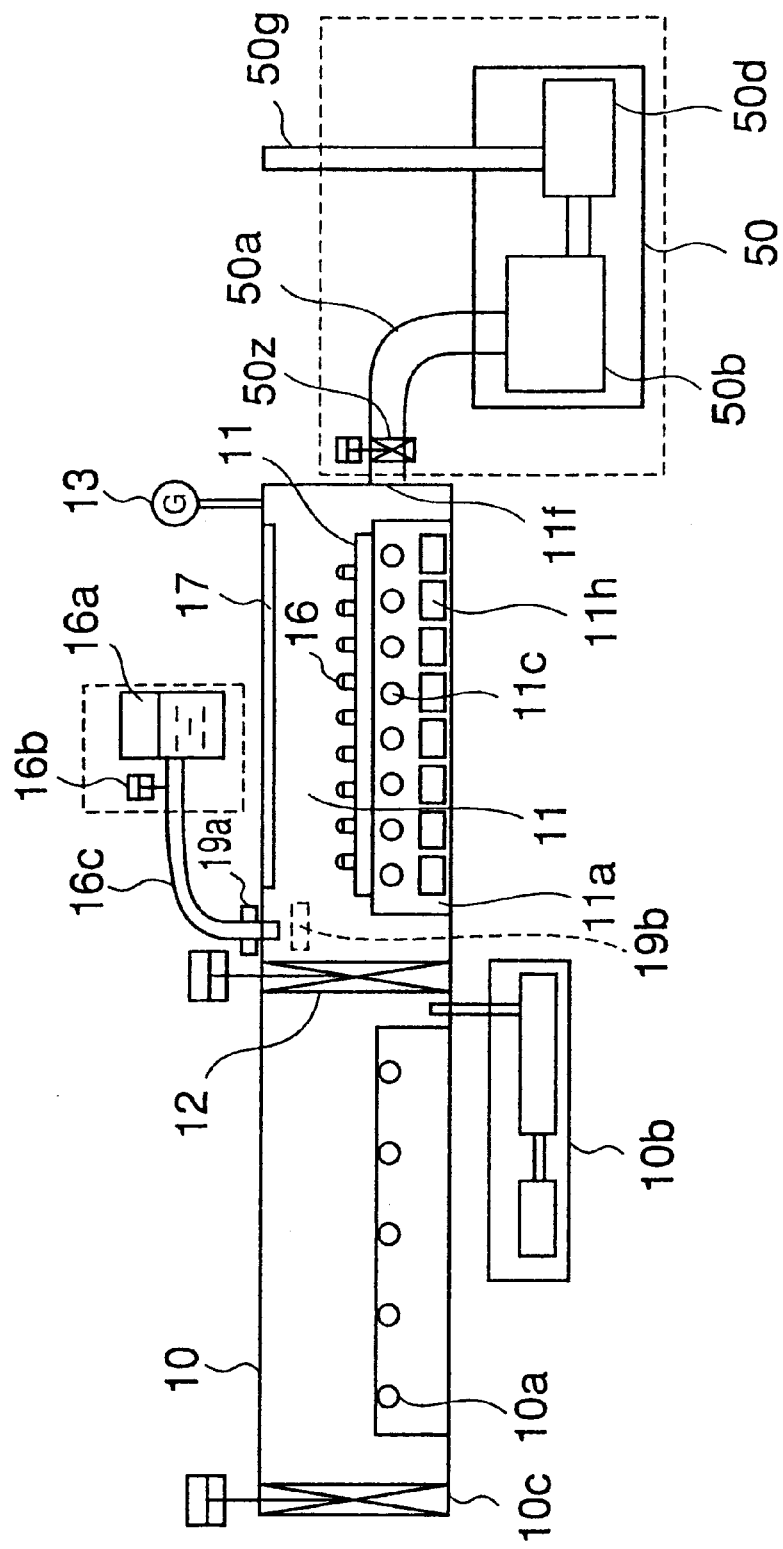

As shown in FIG. 20, for example, the formic acid or the formic acid containing solution is stored in the solution container 16a arranged on the outside of the heating/melting chamber 11. Then, a solution supply port of the solution container 16a is connected to the top portion of the heating/melting chamber 11 via the solution flow rate adjusting valve 16b and the solution/mist introducing pipe 16c. Also, as shown in FIGS. 15A and 15B, the heaters 19a, 19b are provided in the neighborhood of the solution/mist introducing pipe 16c.

According to such configuration, the carboxylic acid discharged from the solution/mist introducing pipe 16c is evaporated in the reduced pressure heating/melting chamber 11 and then heated by the heaters 19a, 19b provided in vicinity of the exhaust end of the solution/mist introducing pipe 16c to accelerate the evaporation. In this case, the best evaporation effect can be expected when the setting temperature of the heaters 19a, 19b is in the range of 50 to 110° C. However, if the heating temperature by the heaters 18a, 18b is excessively increased, there is such a possibility that the mist of the formic acid is bumped to explode or the formic acid is decomposed, and therefore the card must be taken.

Figure 21:
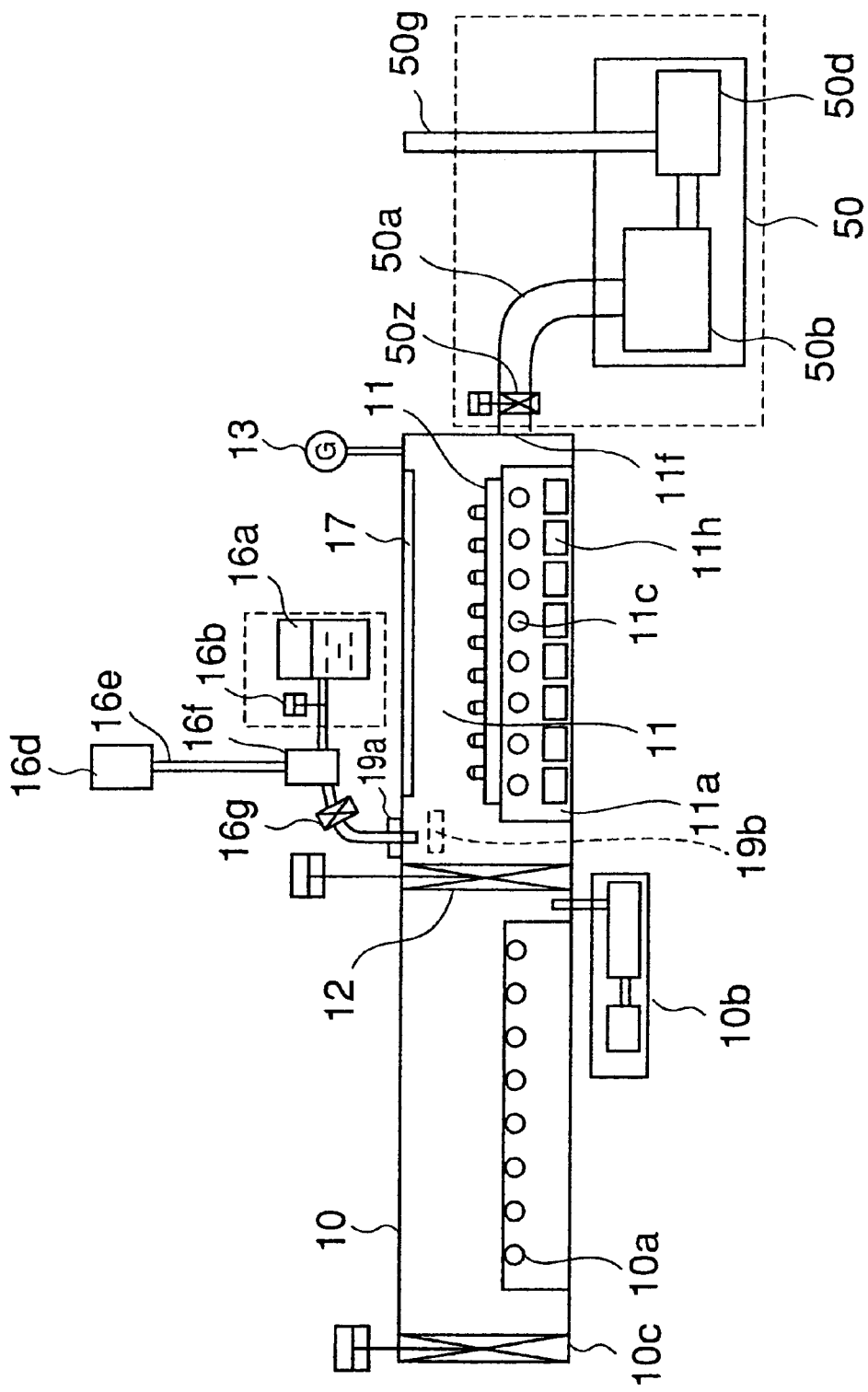
FIG. 21 is a view showing a configuration of a fourth example of a heating/melting process equipment used to heat/melt the solder according to the eleventh embodiment of the present invention.

Besides, as shown in FIG. 21, an inert gas mixing portion 16f may be fitted in the middle of the solution/mist introducing pipe 16c, and an inert gas supply source 16d may be connected to the inert gas mixing portion 16f via an inert gas introducing pipe 16e. An inert gas such as nitrogen, argon, helium, xenon, etc., for example, is sealed in the inert gas supply source 16d. A flow rate in the solution/mist introducing pipe 16c is adjusted by a mass flow controller 16g.

According to such configuration, the formic acid supplied from the solution container 16a and the inert gas supplied from the inert gas supply source 16d are mixed in the mixing portion 16f to form the mist. The evaporation of the mist is accelerated by the heaters 19a, 19b arranged in the neighborhood of the solution/mist introducing pipe 16c.

In the process equipment shown in FIG. 20 and FIG. 21, the formic acid decomposing mechanism (carboxylic acid decomposing mechanism) 51 shown in FIG. 19 may be interposed between the exhaust pump 50 and the first exhaust pipe 50a.

Figure 22:
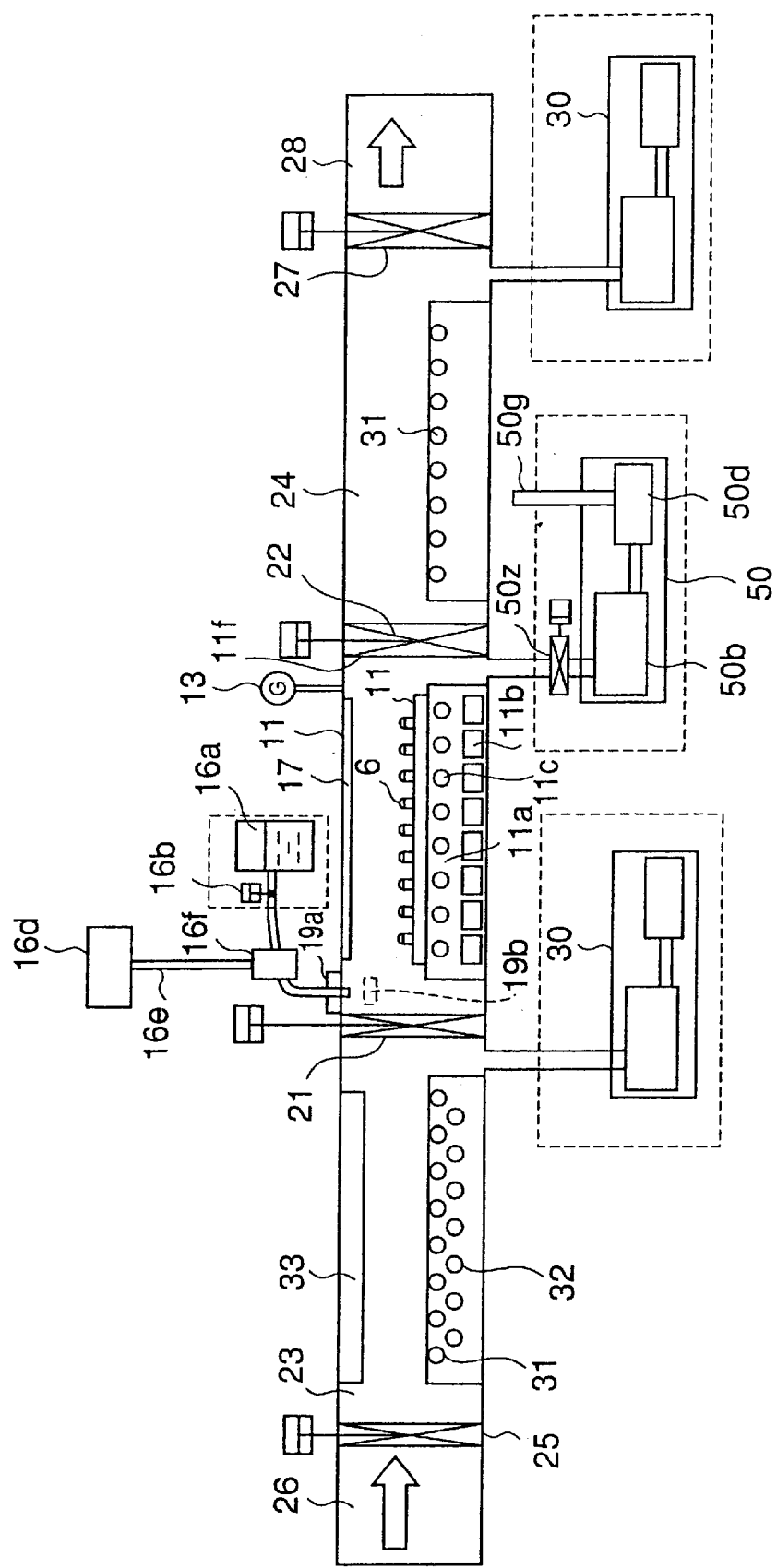
FIG. 22 is a view showing a configuration of a fifth example of a heating/melting process equipment used to heat/melt the solder according to the eleventh embodiment of the present invention.

Meanwhile, in the above process equipments, since the semiconductor wafer 1 carried from the carrying chamber 10 is returned again to the carrying chamber 10 after it is processed in the heating/melting chamber 11, a cost required for the process equipment can be reduced in structure. In contrast, if the reduction in the processing time is wished, two substrate carrying ports may be provided to the heating/melting chamber 11 that has the heaters 19a, 19b and the formic acid recovering mechanism 50d, as shown in FIG. 22, and then the first preliminary exhaust chamber 23 and the second preliminary exhaust chamber 24 shown in FIG. 9 may be provided to these substrate carrying ports. According to the use of such configuration, the wafers can be successively supplied to the heating/melting chamber 11 by fixing the carrying direction of the semiconductor wafer 1 in one direction. Thus, the mass producibility of the solder bump formation can be increased. In FIG. 22, the same references as those in FIG. 9 denote the same elements.

Figure 23:
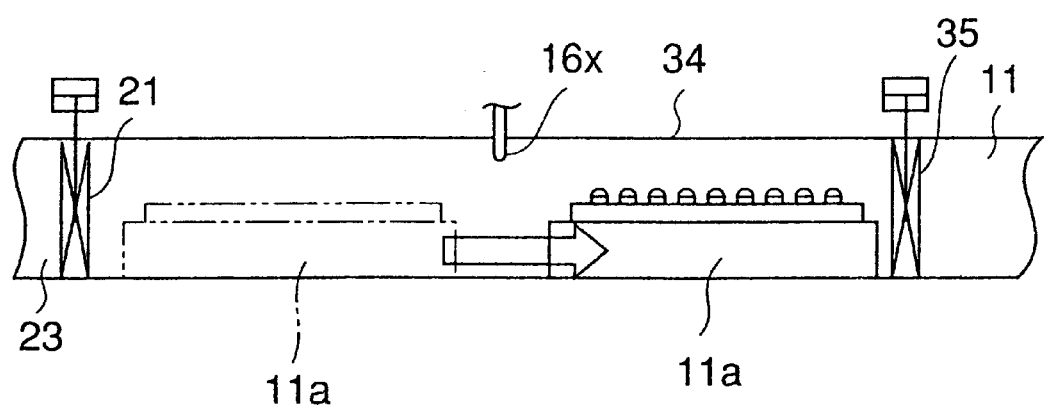
FIG. 23 is a view showing a configuration of a formic acid supplying chamber used in the heating/melting process equipment according to the eleventh embodiment of the present invention.

In the above process equipment, the formic acid is supplied to the semiconductor wafer 1 in the heating/melting chamber 11 along the gas flow. As the mechanism for supplying the formic acid to the solder bumps 6 in the semiconductor wafer 1, other mechanism may be employed. For example, as shown in FIG. 23, a formic acid (carboxylic acid) supplying chamber 34 is provided between the heating/melting chamber 11 and the preliminary exhaust chamber 24, and also a gate valve 35 is provided between the formic acid supplying chamber 34 and the preliminary exhaust chamber 24. Then, such a configuration may be employed that the heating table 11a is arranged movably in the formic acid supplying chamber 34 and also a formic acid mist spray 16x is provided in the center area over the formic acid supplying chamber 34. According to such mechanism, in the middle of the transfer of the heating table 11a, on which the semiconductor wafer 1 is loaded, from the preliminary exhaust chamber 24 to the heating/melting chamber 11, the formic acid or the formic acid containing solution discharged from the formic acid mist spray 16x is supplied onto the semiconductor wafer 1 and is coated thereon. It is preferable that the pressure in the formic acid supplying chamber 34 should be lowered.

According to this, it is possible to supply and coat uniformly the formic acid on a plurality of solder bumps 6 on the semiconductor wafer 1 as a whole. The formic acid that remains on the surface of the solder bumps 6 after the solder bumps 6 are heated/melted and then solidified can be removed by the method set forth in the ninth and tenth embodiments. Also, if the formic acid supplying chamber 34 is arranged before the heating/melting chamber 11, the mechanism for sharing the formic acid to the heating/melting chamber 11 may be omitted.

Twelfth Embodiment

A process equipment in which a plurality of above heating/melting chambers are arranged in parallel and a pre/post heating mechanism for these heating/melting chambers is commonly used will be explained hereunder.

Figure 24:
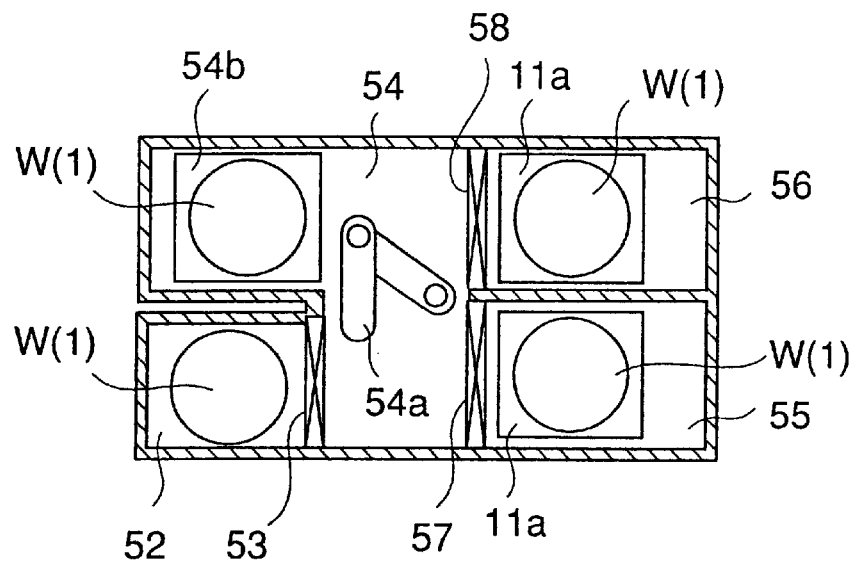
FIG. 24 is a top view showing a first example of a heating/melting process equipment according to a twelfth embodiment of the present invention.
Figure 25:
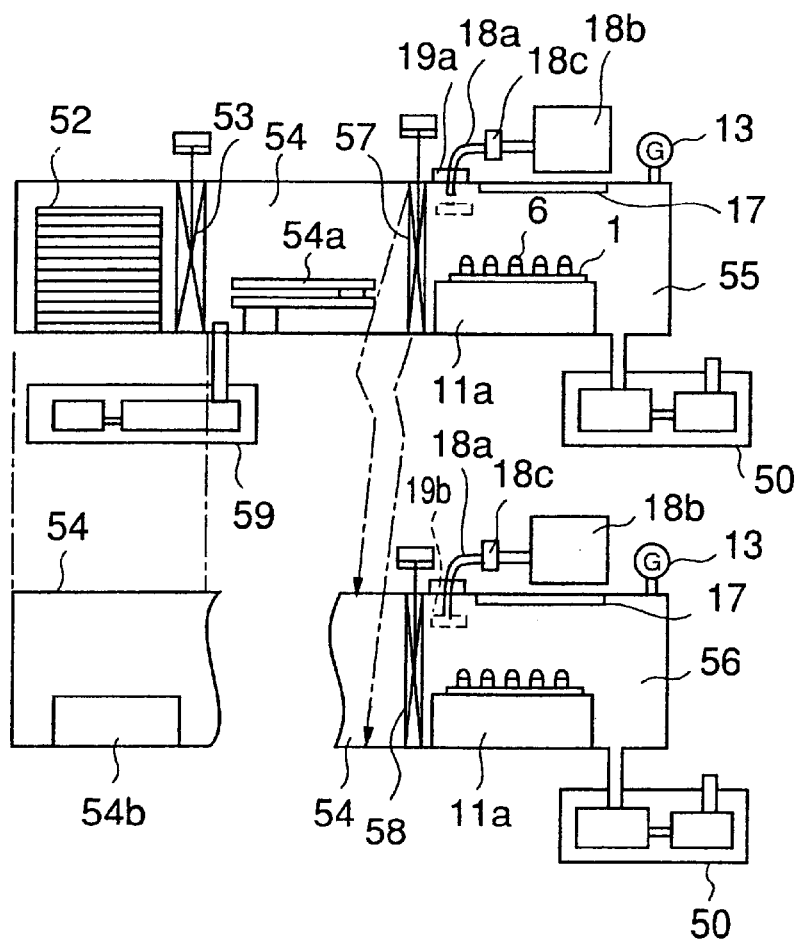
FIG. 25 is a side view showing the first example of the heating/melting process equipment according to the twelfth embodiment of the present invention.

In FIG. 24 and FIG. 25, a sample carrying chamber 54 is positioned adjacent to a sample stocker 52, in which samples w such as semiconductor wafers, electronic parts, etc. are installed, via a first gate valve 53. Then, a carrying mechanism 54a and a pre/post heating mechanism 54b are arranged in the sample carrying chamber 54. The carrying mechanism 54a has a configuration that enable to put/take out the samples w on the pre/post heating mechanism 54b into/from the sample stocker 52 after a first gate valve 53 is opened.

In addition, the sample carrying chamber 54 is connected to the first heating/melting chamber 55 and the second heating/melting chamber 56 via the second gate valve 57 and the third gate valve 58 respectively. A carrying mechanism 54a in the sample carrying chamber 54 is controlled such that the samples w can be carried from the pre/post heating mechanism 54b to the heating table 11a in the first heating/melting chamber 55 or from the heating table 11a to the pre/post heating mechanism 54b after the second gate valve 57 is opened, otherwise the samples w can be carried from the pre/post heating mechanism 54b to the heating table 11a in the second heating/melting chamber 56 or from the heating table 11a tow the pre/post heating mechanism 54b after the third gate valve 58 is opened. An exhaust mechanism 59 is connected to the sample carrying chamber 54 to reduce the pressure in the chamber.

In the first heating/melting chamber 55 and the second heating/melting chamber 56, the same references as those in FIG. 14 denote the same elements.

In the above process equipment, the first gate valve 53 is opened/closed when the samples are carried between the sample carrying chamber 54 and the sample stocker 52, and the second gate valve 57 is opened/closed when the samples w are loaded/unloaded onto/from the first heating/melting chamber 55, and the third gate valve 58 is opened/closed when the samples 2 are loaded/unloaded onto/from the second heating/melting chamber 56.

In the above process equipment, the pressure in the inside of the first heating/melting chamber 55 and the second heating/melting chamber 56 is reduced to the predetermined pressure by the exhaust mechanism 50. Under such condition, the sample in the sample stocker 52, for example, the semiconductor wafer 1, is put into the sample carrying chamber 54, then the pressure in the inside in the sample carrying chamber 54 is reduced to the predetermined pressure, then the semiconductor wafer 1 is loaded on the pre/post heating mechanism 54b by operating the carrying mechanism 54a, and then the semiconductor wafer 1 is heated up to the predetermined temperature. In turn, the heated semiconductor wafer 1 is loaded on the heating table 11a in the first heating/melting chamber 55 by using the carrying mechanism 54a.

Then, during when the semiconductor wafer 1 is processes in the first heating/melting chamber 55, another semiconductor wafer 1 in the sample stocker 52 is loaded into the sample carrying chamber 54 by the carrying mechanism 54a, then the pressure in the sample carrying chamber 54 is reduced to the predetermined pressure, then the semiconductor wafer 1 is loaded onto the pre/post heating mechanism 54b in the sample carrying chamber 54 by operating the carrying mechanism 54a, and then the semiconductor wafer 1 is preliminarily heated up to the predetermined temperature.

Subsequently, the heated semiconductor wafer 1 is loaded onto the heating table 11a in the second heating/melting chamber 56 by using the carrying mechanism 54a. In the course of carrying the semiconductor wafer 1 into the second heating/melting chamber 56, the formic acid is introduced into the first heating/melting chamber 55, and then the solder bumps 6 on the semiconductor wafer 1 are heated/melted and then solidified. Then, during when the semiconductor wafer 1 is processed into the second heating/melting chamber 56, the semiconductor wafer 1 in the first heating/melting chamber 55 is turned onto the pre/post heating mechanism 54b by the carrying mechanism 54a, then post-heated up to the predetermined temperature, and then returned to the sample stocker 52. The carrying mechanism 54a takes out another semiconductor wafer 1 from the sample stocker 52 and carries it onto the pre/post heating mechanism 54b. Then, the heated semiconductor wafer 1 is carried into the first heating/melting chamber 55.

Next, the carrying mechanism 54a returns the semiconductor wafer 1 in the second heating/melting chamber 56 into the pre/post heating mechanism 54b, and then returns it to the sample stocker 52 after the semiconductor wafer 1 is heated under the predetermined conditions. In turn, the carrying mechanism 54a picks up the unprocessed semiconductor wafer 1 from the sample stocker 52 to load onto the pre/post heating mechanism 54b, and then loads it onto the heating table 11a in the second heating/melting chamber 56.

The above carrying and heating operations of the semiconductor wafer 1 are repeated. The semiconductor wafer 1 can be exchanged in the other heating/melting chamber 56 (55) while the sample is being processed in one heating/melting chamber 55 (56). Therefore, the processing efficiency can be enhanced and the processed sheet number per hour can be increased.

By the way, the process equipments shown in FIG. 24 and FIG. 25, since the loading of the sample w into the heating/melting chambers 55, 56 and the unloading of the sample w from the heating/melting chambers 55, 56 have the same route, extra spaces are not needed and the configuration does not become complicated. However, since the loading/unloading of the sample w into/from the heating/melting chambers 55, 56 cannot be performed simultaneously, there is such a possibility that the loading/unloading of the sample w cannot be smoothly performed according to the processing time in the heating/melting chambers 55, 56.

Figure 26:
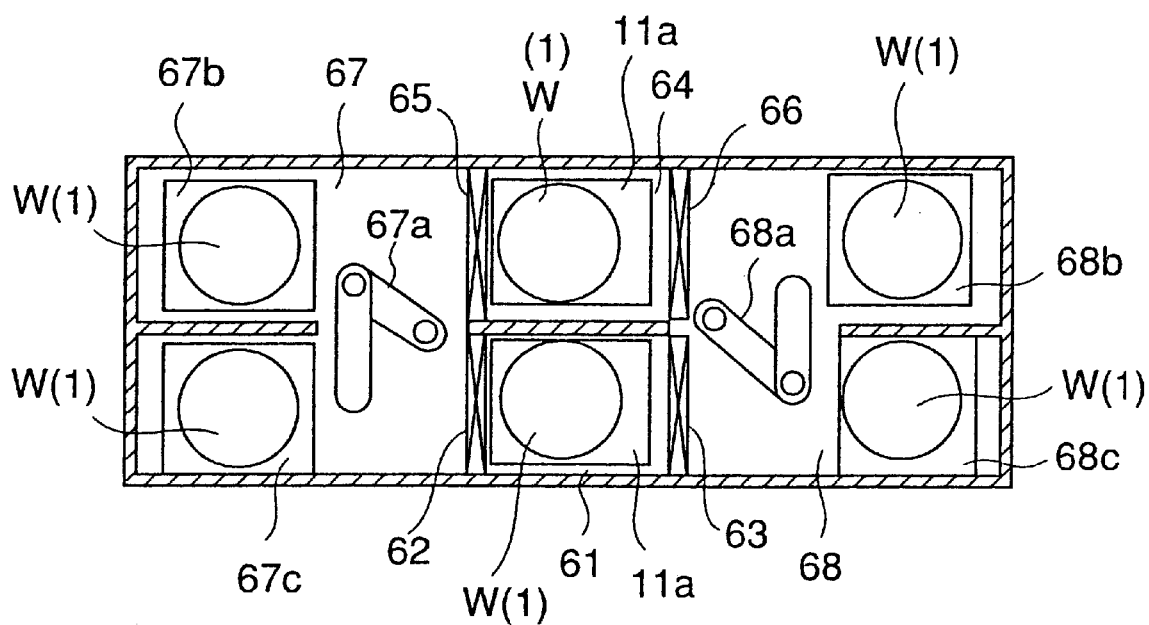
FIG. 26 is a top view showing a second example of a heating/melting process equipment according to the twelfth embodiment of the present invention.
Figure 27:
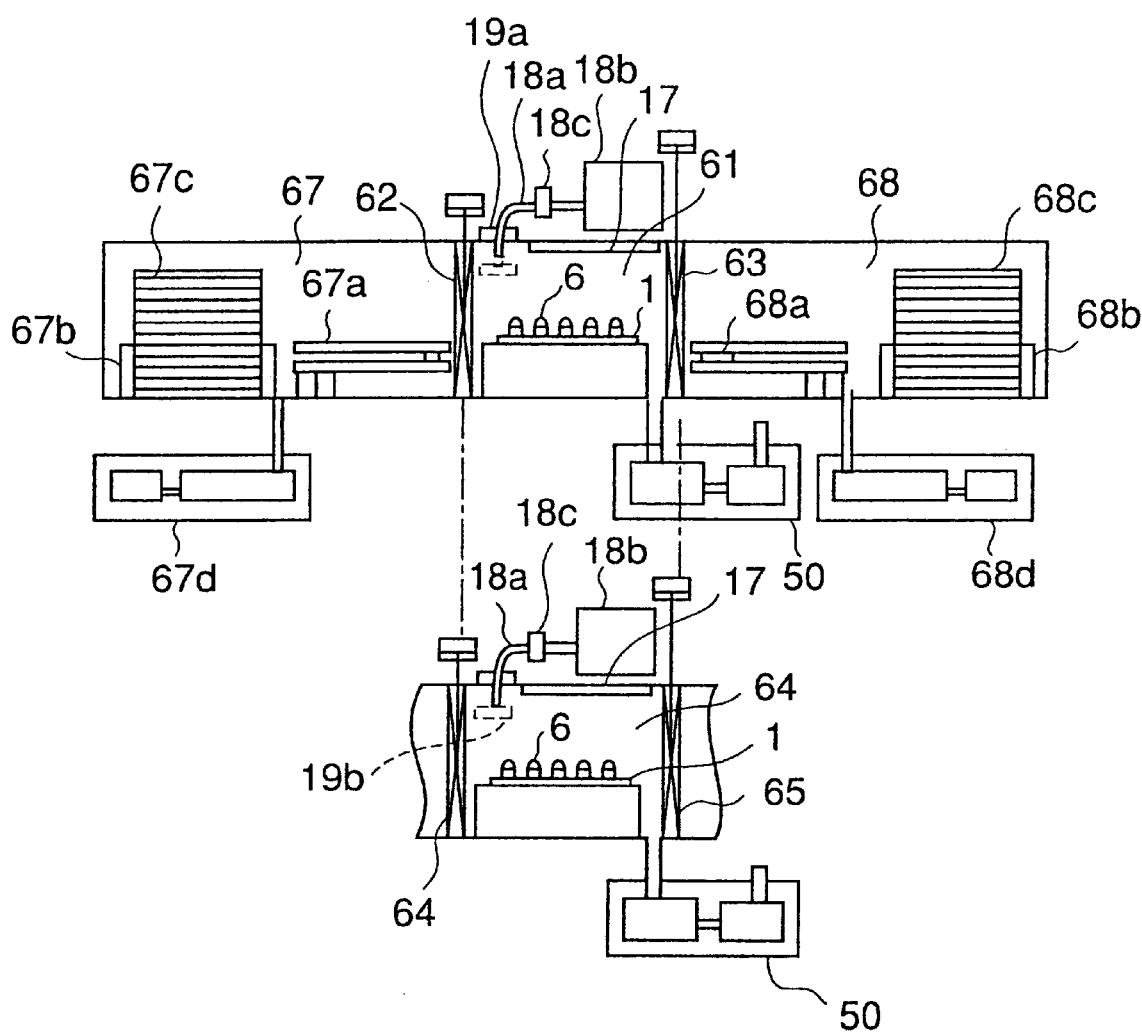
FIG. 27 is a side view showing the second example of the heating/melting process equipment according to the twelfth embodiment of the present invention.

Therefore, as shown in FIG. 26 and FIG. 27, the loading chamber and the unloading chamber that are common to the loading side and the unloading side of a plurality of heating/melting chambers may be provided separately.

In FIG. 26 and FIG. 27, a first gate valve 62 and a second gate valve 63 are provided to the sample loading side and the sample unloading side of a first heating/melting chamber 61 respectively, and a third gate valve 65 and a fourth gate valve 66 are provided to the sample loading side and the sample unloading side of a second heating/melting chamber 64 respectively.

Then, the first heating/melting chamber 61 and the second heating/melting chamber 64 are connected to a common sample loading chamber 67 via the first gate valve 62 and the third gate valve 65 respectively. A carrying mechanism 67a, a pre heating mechanism 67b, and a sample supplying stocker 67c are arranged in the sample loading chamber 67, and also an exhausting mechanism 67d is connected to the sample loading chamber 67.

Also, the first heating/melting chamber 61 and the second heating/melting chamber 64 are connected to a common sample unloading chamber 68 via the second gate valve 63 and the fourth gate valve 66 respectively. A carrying mechanism 68a, a post heating mechanism 68b, and a sample recovering stocker 68c are arranged in the sample unloading chamber 68, and also an exhausting mechanism 68d is connected to the sample unloading chamber 68.

In this case, in FIG. 26 and FIG. 27, the same references as those in FIG. 14 denote the same elements.

In the sample loading chamber 67 of the process equipment shown in FIG. 26 and FIG. 27, the samples w in the sample supplying stocker 67c, e.g., the semiconductor wafers 1, are placed on the pre heating mechanism 68b by the carrying mechanism 67a, then heated under the predetermined conditions, and then loaded onto the heating tables 11a in the first heating/melting chamber 61 and the second heating/melting chamber 64 by the carrying mechanism 67a via the first gate valve 62 and the third gate valve 65. Also, the semiconductor wafers 1, that have been processed in the first heating/melting chamber 61 and the second heating/melting chamber 64, are loaded onto the post heating mechanism 68b by the carrying mechanism 68a in the sample unloading chamber 68 via the second gate valve 63 and the fourth gate valve 66, then heated under the predetermined conditions, and then stored in the sample recovering stocker 68c.

Accordingly, since the sample loading mechanism is provided on the loading side of a plurality of heating/melting chambers 61, 64 and the sample unloading mechanism is provided on the unloading side, the processing time can be shortened, for example, the loading/unloading of the samples can be performed simultaneously, the exchange cycle of the sample stocker 67c can be shortened, etc.

In the ninth to twelfth embodiments, the formic acid is used after the solder has been heated/melted. But other carboxylic acids may be used.

Also, as the solder material in the above embodiments, lead-tin solder containing tin of more than 40 at. %, solder containing tin of more than 80 at. % and not containing lead, solder containing indium of more than 40 at. %, solder containing lead or tin, lead-tin solder, tin-silver containing solder, etc. may be used.

In the electronic parts mounting method set forth in claim 16, the atmosphere is exhausted when the solder layer is held at the first temperature.

In the heating/melting process equipment set forth in claim 21, (1) the exhausting means is the exhaust pump that has the corrosion resistance for the formic acid, or (2) the cooling mechanism is further provided that cools the heating object device below the melting point of the solder within one minute after the heating object device heated/melted by the heater, or (3) the carboxylic acid supplying means may be formed of the carboxylic acid gas supplying means or the carboxylic acid mixed solution supplying means, or (4) at least one of the cooling mechanism, the vacuum gauge, and the pressure adjusting mechanism may be provided to the chamber, or (5) the flow rate adjusting mechanism may be provided to the carboxylic acid gas supplying means or the carboxylic acid mixed solution supplying means.

As described above, according of the present invention, in the step of forming the solder bumps on the connected material or the step of mounting the solder of the electronic parts onto the connected material, the solder is heated/melted in the reduced pressure atmosphere containing the carboxylic acid. Therefore, the oxidized layer on the surface of the connected material can be removed without the residue, and good surface shapes of the bumps or good shapes of the soldering joint portions can be achieved. In addition, generation of the voids in the solder bumps and the soldering joint portion can be suppressed. Furthermore, an embrittling phenomenon of the connected material does not occur, and also peel-off of the connected material can be prevented.

According to the heating/melting process equipment for performing such processes, since the carboxylic acid recovering mechanism and the carboxylic acid decomposing mechanism are provided on the exhaust side of the heating/melting chamber, scattering of the carboxylic acid, e.g., the formic acid into the air can be prevented. Also, since the heating mechanism for heating the carboxylic acid is provided to the portion that discharges the carboxylic acid into the chamber, the droplet state of the carboxylic acid on the surface of the solder can be suppressed. As a result, the carboxylic acid is difficult to remain on the surface of the solder after the solder has been heated/melted, and thus reoxidation of the solder can be prevented.

What is claimed is:

1. A heating/melting process equipment comprising:
    a chamber for loading a heating object device on which a solder is exposed;
    a heater provided into the chamber, for heating the solder;
    an exhausting means for reducing a pressure in the chamber; and
    a formic acid supplying device for supplying a carboxylic acid into the chamber, the formic acid supplying device having a pipe for discharging the formic acid, and a second heater for accelerating evaporation of the formic acid from a top end of the pipe.

2. A heating/melting process equipment according to claim 1, wherein a recovering mechanism for recovering the formic acid is provided or fitted on a suction side or an exhaust side of the exhausting means.

3. A heating/melting process equipment according to claim 2, wherein the recovering mechanism has a configuration that passes a gas exhausted from the chamber into a solution.

4. A heating/melting process equipment according to claim 3, wherein the solution is water or alcohol.

5. A heating/melting process equipment according to claim 1, wherein a decomposing mechanism for decomposing the formic acid is provided or fitted on a suction side or an exhaust side of the exhausting means.

6. A heating/melting process equipment according to claim 5, wherein the decomposing mechanism has a configuration that heats the gas exhausted from the chamber up to a temperature of more than 200° C.

7. A heating/melting process equipment according to claim 1, wherein the pipe is connected to the chamber and has a corrosion resistance for the carboxylic acid.

8. A heating/melting process equipment according to claim 1, wherein a heating temperature of the second heater is set in a range of 50 to 110° C.

9. A heating/melting process equipment according to claim 1, wherein the formic acid supplying device has either a configuration that evaporates the formic acid solution or a configuration that mixes the formic acid solution with an inert gas.

10. A heating/melting process equipment according to claim 1, wherein another chamber is provided adjacent to the chamber, and a carrying mechanism for a heating/melting object device is provided to these chambers.

11. A heating/melting process equipment according to claim 1, wherein a preliminary heating mechanism is provided to another chamber.

12. A heating/melting process equipment comprising:
    a chamber for loading a heating object device on which a solder is exposed;
    a heater provided into the chamber, for heating the solder;
    an exhausting means for reducing a pressure in the chamber; and
    a coating means for coating a formic acid or a formic acid containing solution onto the solder before the heating object device is inserted into the chamber.

13. A heating/melting process equipment according to claim 12, wherein the coating means is a means for causing the solder to pass through an area containing the formic acid or a formic acid containing solution that is sprayed like a mist.

14. A heating/melting process equipment according to claim 12, wherein a recovering mechanism for recovering the formic acid is provided or fitted on a suction side or an exhaust side of the exhausting means.

15. A heating/melting process equipment according to claim 14, wherein the recovering mechanism has a configuration that passes a gas exhausted from the chamber into a solution.

16. A heating/melting process equipment according to claim 15, wherein the solution is water or alcohol.

17. A heating/melting process equipment according to claim 12, wherein a decomposing mechanism for decomposing the formic acid is provided or fitted on a suction side or an exhaust side of the exhausting means.

18. A heating/melting process equipment according to claim 17, wherein the decomposing mechanism has a configuration that heats the gas exhausted from the chamber up to a temperature of more than 200° C.

* * * * *